United States Patent
Shionoiri et al.

(10) Patent No.: US 9,088,269 B2
(45) Date of Patent: Jul. 21, 2015

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Yutaka Shionoiri, Kanagawa (JP); Yuto Yakubo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/199,500

(22) Filed: Mar. 6, 2014

(65) Prior Publication Data

US 2014/0266305 A1    Sep. 18, 2014

(30) Foreign Application Priority Data

Mar. 14, 2013    (JP) .................. 2013-051944

(51) Int. Cl.
  H03K 17/16    (2006.01)
  H03K 3/012    (2006.01)
  H03K 3/356    (2006.01)
  H03K 19/00    (2006.01)

(52) U.S. Cl.
  CPC .......... *H03K 3/012* (2013.01); *H03K 3/356113* (2013.01); *H03K 19/0016* (2013.01)

(58) Field of Classification Search
  CPC ................................................ H03K 19/0016
  USPC .................. 326/21, 26–28, 93, 112
  See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,069,512 A * | 5/2000 | Rodriguez et al. | 327/200 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Don Le
(74) *Attorney, Agent, or Firm* — Fish & Richardson P.C.

(57) ABSTRACT

A semiconductor device having a power-saving circuit. The semiconductor device includes an input-output terminal and a holding circuit. When the input-output terminal is used, an inverter loop of the holding circuit is made not to operate by controlling a switch, and when the input-output terminal is not used, the inverter loop of the holding circuit operate by controlling the switch. Power consumption of the holding circuit can be reduced. An OS transistor is preferably used for the switch.

19 Claims, 15 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,817,516 B2* | 8/2014 | Koyama .................. 365/72 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0174190 A1* | 9/2004 | Li et al. ................. 327/55 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0181024 A1* | 7/2008 | Kim ................. 365/189.06 |
| 2008/0182358 A1 | 7/2008 | Cowdery-Corvan et al. |
| 2008/0224133 A1 | 9/2008 | Park et al. |
| 2008/0247249 A1* | 10/2008 | Lee ................. 365/205 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0102515 A1* | 4/2009 | Miyatake .................. 327/52 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189685 A1* | 7/2009 | Terzioglu et al. ............. 327/544 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0259997 A1* | 10/2010 | Kishiyama ............... 365/189.05 |
| 2012/0169378 A1* | 7/2012 | Dubey et al. .................... 327/52 |
| 2012/0206182 A1* | 8/2012 | Dally .......................... 327/215 |
| 2014/0152366 A1* | 6/2014 | Trivedi et al. ................. 327/295 |
| 2014/0225641 A1 | 8/2014 | Kozuma et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-362346 A | 12/2004 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—Bo Systems [A; Fe, Ga, Or, Al; B: Mg, Mn, Fe, Ni, Cu,Or Zn] at Temperatures over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1. 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of The 13th International Display Workshops, Dec. 7, 2006, pp. 663-666.

Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of The 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs with a Novel Passivation Layer", SID

(56) References Cited

OTHER PUBLICATIONS

Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2006, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of The 16th International Display Workshops, 2009, pp. 689-692.

Son.K et al., "42.4L: Late-News Paper: 4 Inch QVGA AMOLED Driven by the Threshold Voltage Controlled Amorphous GiZo (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IgZo Transparent Amorphous Oxide Semiconductor", IDW '08 : Proceedings of The 15th International Display Workshops, Dec. 3, 2008, pp. 1637-1640.

Tsuda.K et al., "Ultra Low Power Consumption Technologies for Mobile TFT-LCDs", IDW '02 : Proceedings of The 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

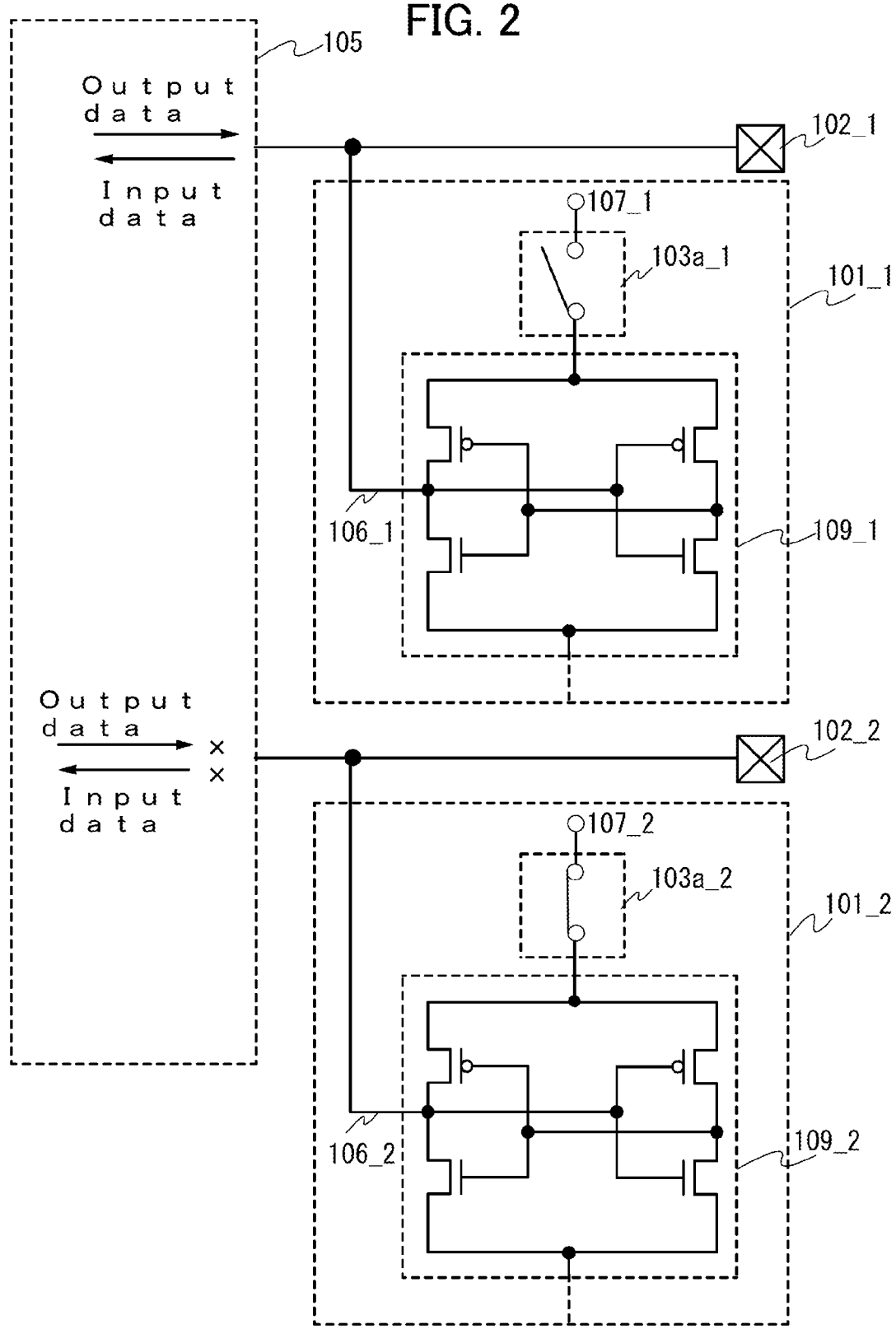

SEMICONDUCTOR DEVICE

BACKGROUND OF THE INVENTION

1. Field of the Invention

The present invention relates to a semiconductor device. Furthermore, the present invention relates to a method for manufacturing a semiconductor device.

2. Description of the Related Art

A bus keeper circuit is provided to maintain the final potential of a bus. The bus keeper circuit has a latch structure using an inverter. In such a bus keeper circuit, shoot-through current tends to be generated. Accordingly, a circuit to prevent shoot-through current is proposed (see Patent Document 1).

REFERENCE

Patent Document

Japanese Published Patent Application No. 2004-362346

SUMMARY OF THE INVENTION

Patent document 1 discloses that the bus keeper circuit is invalidated when an output buffer is set into an output mode. Specifically, when the output buffer is brought into the output mode, a plurality of transistors constituting an inverter group in the bus keeper circuit are turned off to invalidate the bus keeper circuit.

However, the plurality of transistors that are turned off to invalidate the bus keeper circuit are provided for each pad, and thus electric power is needed to control them. Additionally, the area is increased because the plurality of transistors are added.

In view of the above, an object of one embodiment of the present invention is to provide a semiconductor device having a novel circuit.

As illustrated in FIG. 1A, one embodiment of the present invention includes a first circuit 101 that is electrically connected to an input-output terminal 102. The first circuit 101 includes a plurality of inverters, and a first inverter and a second inverter of the plurality of inverters constitute an inverter loop 109. The inverter loop means one where the first inverter and the second inverter are electrically and circularly connected to each other. An output terminal of the first inverter is electrically connected to an input terminal of the second inverter, and an input terminal of the first inverter is electrically connected to an output terminal of the second inverter. The inverter loop 109 illustrated in FIG. 1A includes an input-output terminal 106 that serves as both an input terminal and an output terminal. The input-output terminal 106 of the inverter loop 109 is electrically connected to the input terminal and the output terminal of the first inverter and the input terminal and the output terminal of the second inverter.

The first circuit 101 includes at least a first switch 103a. The first switch 103a is electrically connected between the inverter loop 109 and a power source 107. In other words, the first switch 103a has a function of blocking the electric connection between the inverter loop 109 and the power source 107. Note that examples of the power source 107 are a high-potential power source (VDD) and a low-potential power source (VSS, GND).

On/off of the first switch 103a is controlled in response to a signal from a control terminal. When the first switch 103a is on, power is consumed by the inverter loop 109. When the first switch 103a is off, power is not supplied to the inverter loop 109 and thus shoot-through current does not flow, leading to power saving.

The input-output terminal 102 is electrically connected to the input-output terminal 106 of the inverter loop 109 included in the first circuit 101. When the first switch 103a is off, power is not supplied to the inverter loop 109, and thus shoot-through current does not flow, leading to power saving of the first circuit 101.

The time when the first switch 103a is off is at least a time when a signal is input to each functional circuit of a central processing unit 105 through the input-output terminal 102. The time when the first switch 103a is off is at least a time when a signal is output from each functional circuit of the central processing unit 105 through the input-output terminal 102. In these states, the potential of the input-output terminal 102 is a constant potential based on an input signal or an output signal, and thus the potential of the input-output terminal 102 is not required to be maintained by the inverter loop 109. Therefore, the time when a signal is input to or output from the central processing unit 105 is a period when the potential of the input-output terminal 102 is not required to be maintained by the first circuit 101. In this period, the first switch 103a is turned off, leading to power saving of the first circuit 101.

The first switch 103a can be provided for any current path as long as the above effect can be obtained.

For the first switch 103a enabling such an operation, a transistor using an oxide semiconductor layer as a channel (hereinafter referred to as OS transistor) can be used. FIG. 1B is a diagram of a circuit in which an OS transistor 103b is used. A gate of the OS transistor 103b is electrically connected to a first wiring 108, and a signal to control on/off of the transistor is supplied from the first wiring. The first wiring can be referred to as a control line.

By controlling the on/off of the OS transistor 103b, the electrical connection between the input-output terminal 102 and the inverter loop 109 or the like can be controlled. In other words, by turning off the OS transistor, power supply to the inverter loop 109 can be stopped, leading to power saving. As a result, as compared with a conventional case where power is constantly supplied, low power consumption can be achieved. In addition, the number of transistors to be controlled can be reduced as compared with the structure disclosed in Patent Document 1, and thereby the power consumption can be reduced and the area can be reduced.

Furthermore, when the OS transistor is used, since a current flowing when the OS transistor is off (off-state current) is extremely small as compared with off-state current flowing when a transistor using silicon as a channel (Si transistor) is off, the OS transistor can contribute to lowering power consumption.

The on/off control of the first switch 103a is described with reference to FIG. 2. In FIG. 2, the first switch 103a in FIG. 1A is illustrated, but the description here applies to the OS transistor 103b in FIG. 1B.

FIG. 2 illustrates a plurality of input-output terminals (102_1 and 102_2). One of the plurality of input-output terminals, the input-output terminal 102_1, is activated. The phrase "the input-output terminal 102_1 is activated" means at least a state where data is input to a circuit in the central processing unit 105 through the input-output terminal 102_1 (Input data) or a state where data is output from a circuit in the central processing unit 105 through the input-output terminal 102_1 (Output data).

When data is input or output, a potential based on the data is supplied to the input-output terminal 102_1 and the potential of the input-output terminal 102_1 is not required to be maintained by the first circuit 101_1. Thus, the first switch 103a_1 is off. At this time, because the inverter loop 109_1 is not supplied with power, shoot-through current does not flow, and thus power consumed by the first circuit 101_1 can be reduced.

On the other hand, the other of the plurality of input-output terminals, the input-output terminal 102_2, is non-activated. The phrase "the input-output terminal 102_2 is non-activated" means at least a state where a signal as Input data is not input through the input-output terminal 102_2 or a signal as Output data is not output through the input-output terminal 102_2.

When data is not input or output, the inverter loop 109_2 is required to maintain the final potential of the input-output terminal 102_2, and thus the first switch 103a_2 is turned on. At this time, the potential of the input-output terminal 102_2 is supplied to the inverter loop 109_2, and the inverter loop 109_2 operates, so that the final potential of the input-output terminal 102_2 can be maintained.

Here is illustrated the example in which the first circuit 101 electrically connected to the input-output terminal 102 is connected to the central processing unit 105, but the circuit electrically connected to the input-output terminal 102 is not limited to the central processing unit 105. The present invention can be applied to at least cases where the potential of the node should be maintained and is not required to be maintained at a node to which a circuit or a terminal is electrically connected, thereby reducing the power consumption.

The input-output terminal 102 may be electrically connected to a protection circuit so that the input-output terminal 102 can be protected from electrostatic damages (ESD). The protection circuit includes a resistor, a diode, or the like.

In this manner, when the input-output terminal is activated, the electrical connection between the input-output terminal and the first circuit is blocked, and when the input-output terminal is non-activated, the input-output terminal is electrically connected to the first circuit. In a conventional manner, regardless of the use/non-use of the input-output terminal, the inverter loop is constantly supplied with power. However, in accordance with one embodiment of the present invention, the first circuit does not consume power at least when the input-output terminal is used, and therefore, low power consumption of a semiconductor device can be achieved. Moreover, as compared with the structure disclosed in Patent Document 1, the number of transistors to be controlled can be reduced, and thereby the power consumption and the area can be reduced.

Furthermore, when the OS transistor is used as the first switch 103a, since the current flowing when the OS transistor is off (off-state current) is extremely small as compared with off-state current flowing when a Si transistor is off, the OS transistor can contribute to lowering power consumption.

Si transistor can be used as the transistors other than the first switch 103a. The mobility of the Si transistor is higher than that of the OS transistor, and thus high-speed operation of the semiconductor device can be achieved when the Si transistors are used for the transistors other than the first switch 103a.

In addition, the first circuit can be referred to as a holding circuit because it can hold the potential of the input-output terminal, that is, the potential of a wiring electrically connected to the first circuit. The holding circuit desirably has a high input impedance and a low output impedance. In a conventional manner, regardless of the use/non-use of the input-output terminal, the holding circuits electrically connected to all input-output terminals are supplied with power, and thus when the input-output terminal is used as the input terminal, the impedance is lowered. However, since the off-state current is extremely low by using an OS transistor for the first switch as described above, the high-input impedance and the low output impedance of the holding circuit can be maintained.

With such a new circuit structure, the power consumption of the semiconductor device can be reduced as compared with the conventional structure.

BRIEF DESCRIPTION OF THE DRAWINGS

FIG. 2 is a diagram illustrating a semiconductor device in accordance with one embodiment of the present invention.

DETAILED DESCRIPTION OF THE INVENTION

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

(Embodiment 1)

Figure 1A:
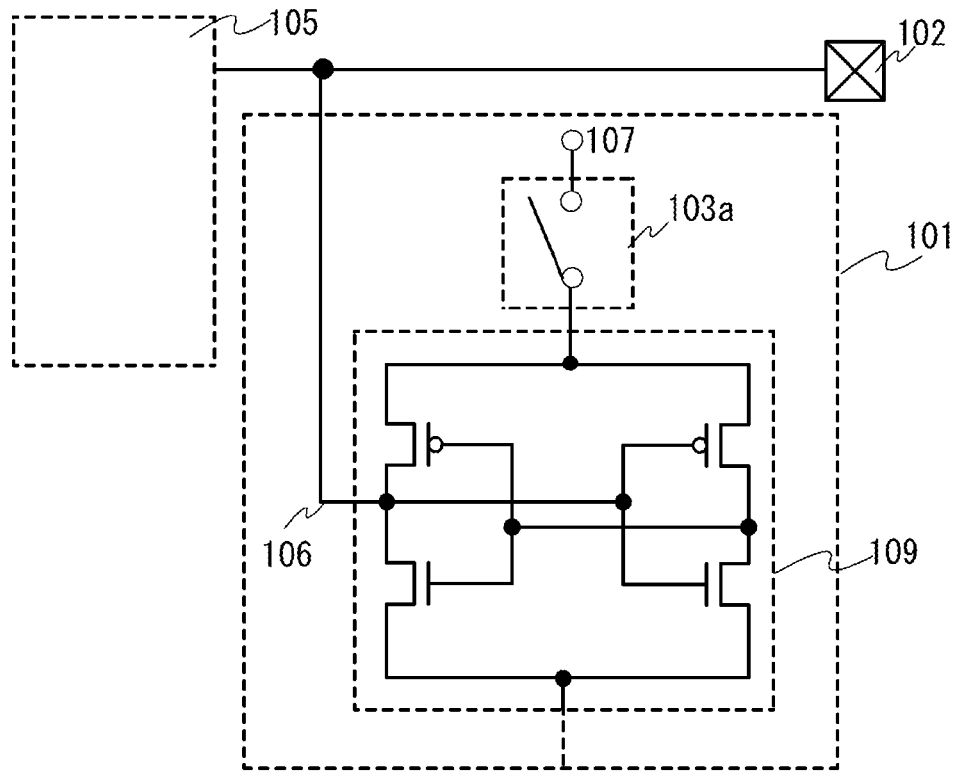
FIGS. 1A and 1B are each a diagram of a semiconductor device in accordance with one embodiment of the present invention.
Figure 1B:
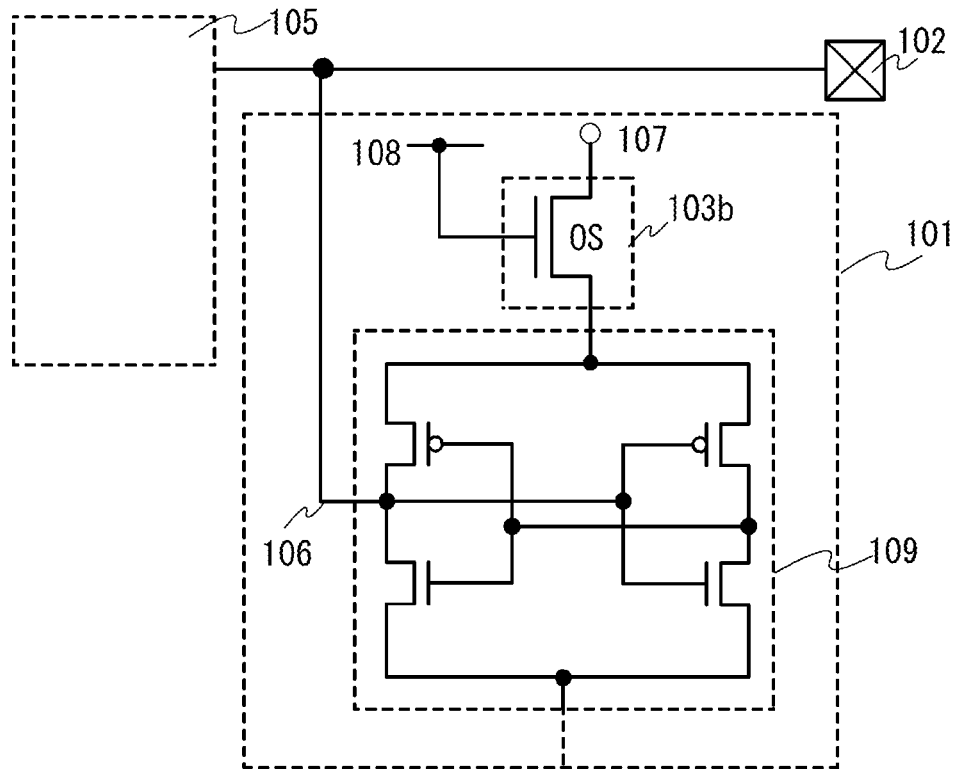
Figure 3:
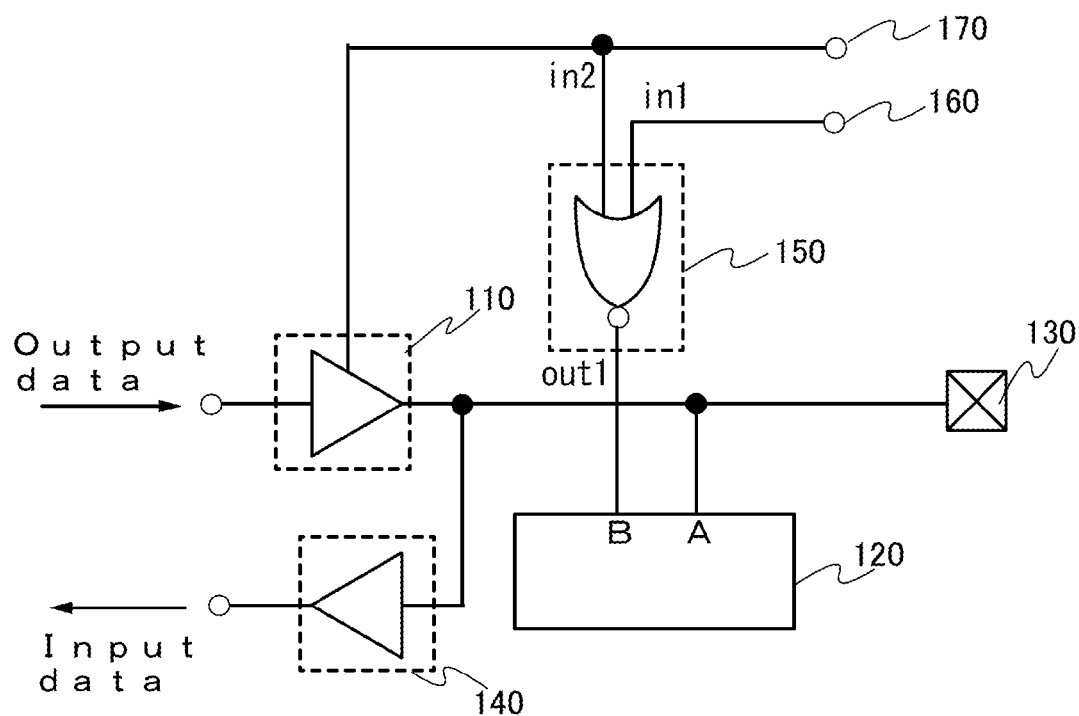
FIG. 3 is a diagram illustrating a semiconductor device in accordance with one embodiment of the present invention.

FIG. 3 illustrates one embodiment of the present invention. The embodiment includes an input-output terminal 130 and a holding circuit 120 electrically connected to the input-output terminal 130. The terminal of the holding circuit 120 that is connected to the input-output terminal 130 is referred to as a terminal A. In addition to these, the embodiment includes a three-state buffer 110, a buffer circuit 140, and a selection circuit 150. The input-output terminal 130 is electrically connected to an output terminal of the three-state buffer 110 and an input terminal of the buffer circuit 140. The holding circuit 120 is electrically connected to the selection circuit 150. The terminal of the holding circuit 120 that is connected to the selection circuit 150 is referred to as a terminal B. The selection circuit 150 can include a NOR. The entire circuit illustrated in FIG. 3 can be referred to as an input-output circuit.

The selection circuit 150 has a function of supplying a signal to stop the holding circuit 120 from consuming power. To control the state of the input-output terminal 130, a signal supplied to the selection circuit 150 is used also as a control signal for the three-state buffer 110.

For example, a control signal 1 (in1) is input to the selection circuit 150 from a terminal 160, and a control signal 2 (in2) is input to the selection circuit 150 from a terminal 170. The control signal 2 (in2) is input also as a control signal for the three-state buffer 110.

Table 1 is a truth table of the selection circuit 150 based on the combination of Hi (1) and Lo (0) of the control signal 1 and the control signal 2. As seen in Table 1, the input-output circuit including the holding circuit can have three states excluding a forbidden state. In Table 1, "in1" is the control signal 1 input to the selection circuit 150 from the terminal 160, "in2" is the control signal 2 input to the selection circuit 150 from the terminal 170, and "out1" is a signal output from the selection circuit 150. The signal output from the selection circuit 150 is input to the terminal B of the holding circuit 120. The control signal 2 is used also as the control signal for the three-state buffer 110.

TABLE 1

| | | | Input-output circuit | |
|---|---|---|---|---|
| in1 | in2 | out1 | Input-output terminal 130 | Holding circuit 120 |
| 0 | 0 | 1 | Non-use | Use |
| 0 | 1 | 0 | Forbidden | — |
| 1 | 0 | 0 | Input | Non-use |
| 1 | 1 | 0 | Output | Non-use |

Switching whether the input-output terminal 130 functions as the input terminal, functions as the output terminal, or is not used (in a non-use state) can be conducted based on the control signal 1 and the control signal 2 as seen in Table 1 above.

A case where the input-output terminal 130 is not used (in a non-use state) and the holding circuit 120 is used (in a use-state) is described. At this time, the control signal 1 (in1) and the control signal 2 (in2) are "0" and the "out1" is "1". A signal "1" is input to the terminal B of the holding circuit 120. As the switch electrically connected to the terminal B, a switch that is turned on based on the signal "1" is used.

In addition, as the control signal for the three-state buffer 110, "0" is input and thus the output of the three-state buffer 110 takes high impedance and is separated from the input-output terminal 130. The input-output terminal 130 is electrically connected to the buffer circuit 140, and is controlled not to be supplied with a signal by another circuit electrically connected to the buffer circuit 140 or a programme. In this manner, the input-output terminal 130 can be brought into the non-use state.

The input-output terminal 130 is electrically connected to the terminal A. Therefore, a potential of the input-output terminal 130 is supplied to an inverter loop of the holding circuit 120 through the terminal A. Furthermore, the switch electrically connected to the terminal B is on as described above; thus, the potential of the input-output terminal 130 can be maintained by the inverter loop of the holding circuit 120.

In this manner, when the input-output terminal 130 is not used, the final potential of the input-output terminal 130 is supplied to the inverter loop of the holding circuit 120, and the potential is kept constant. As seen in Table 1, the holding circuit 120 is a state being used.

As seen in the second row in Table 1, when the control signal 1 (in1) is "0" and the control signal 2 (in2) is "1", an output state is selected even though the input-output circuit is not selected. For that reason, this state is forbidden. The forbidden state is determined in advance by a programme.

A case where the input-output terminal 130 shown in the third row in Table 1 functions as an input terminal is described. In this case, the control signal 1 (in1) is "1", the control signal 2 (in2) is "0", and the "out1" is "0". The signal "0" is input to the terminal B of the holding circuit 120. As the switch electrically connected to the terminal B, a switch that is turned off in response to the signal "0" is used. The signal "0" is input as the control signal for the three-state buffer 110, and thus the output of the three-state buffer 110 takes high impedance and the connection between the three-state buffer 110 and the input-output terminal 130 is separated. Then, the input-output terminal 130 is electrically connected to the buffer circuit 140 and can be supplied with a signal by another circuit electrically connected to the buffer circuit 140 or a programme. In this manner, the input-output terminal 130 can serve as an input terminal. The potential of the input-output terminal 130 is a potential of an input signal, and thus the potential of the input-output terminal 130 is not required to be maintained by the holding circuit 120, so that the holding circuit 120 is not used (is in a non-use state). When the input-output terminal 130 serves as an input terminal, power is not supplied to the inverter loop of the holding circuit 120, and thus a shoot-through current does not flow and power consumption can be reduced.

A case where the input-output terminal 130 shown in the fourth column in Table 1 serves as an output terminal is described. In this case, the control signal 1 (in1) and the control signal 2 (in2) are "1", and the "out1" is "0". The signal "0" is input to the terminal B of the holding circuit 120. As the switch electrically connected to the terminal B, a switch that is turned off in response to the signal "0" is used. In addition, the signal "1" is input as the control signal for the three-state buffer 110, and thus the output of the three-state buffer 110 is electrically connected to the input-output terminal 130, and a signal cannot be supplied to the input-output terminal 130 side by another circuit electrically connected to the buffer circuit 140 or a programme, so that the input-output terminal 130 can serve as an output terminal. At this time, the potential of the input-output terminal 130 is a potential of the output signal, and thus the potential of the input-output terminal 130 is not required to be maintained by the holding circuit 120, so that the holding circuit 120 is not used. When the input-output terminal 130 serves as an output terminal, power is not supplied to the inverter loop of the holding circuit 120, and thus a shoot-through current does not flow and power consumption can be reduced.

In this manner, the non-use state of the holding circuit 120 can be selected in accordance with the state of the input-output terminal 130, thereby preventing power from being wasted.

The example where the selection circuit 150 includes a NOR is described here, but the selection circuit 150 is not limited to a NOR. Any circuit that can select each state in response to the control signal 1 and the control signal 2 as seen in Table 1 can be used.

In addition, the input-output terminal 130 may be electrically connected to the protection circuit. The protection circuit includes a resistor, a diode, or the like, Examples of the holding circuit 120 enabling the above operation are shown. In the holding circuit 120 illustrated in FIG. 4, an OS transistor is used for the switch electrically connected to the terminal B. When an OS transistor 113 is an n-channel transistor, it is turned on upon the input of a signal "1" to the terminal B and turned off upon the input of a signal "0" to the terminal B. Note that the terminal B is electrically connected to the selection circuit 150.

The first inverter 100a includes a p-channel transistor 110a and an n-channel transistor 111a. The second inverter 100b includes a p-channel transistor 110b and an n-channel transistor 111b. The input terminal of the first inverter 100a is electrically connected to the output terminal of the second inverter 100b, and the output terminal of the first inverter 100a is electrically connected to the input terminal of the second inverter 100b, and thus the first and the second inverters are electrically connected in a loop pattern, that is, they form an inverter loop. The input-output terminal of the inverter loop can be electrically connected to the terminal A, and the terminal A can be electrically connected to the input-output terminal 130.

Figure 4:
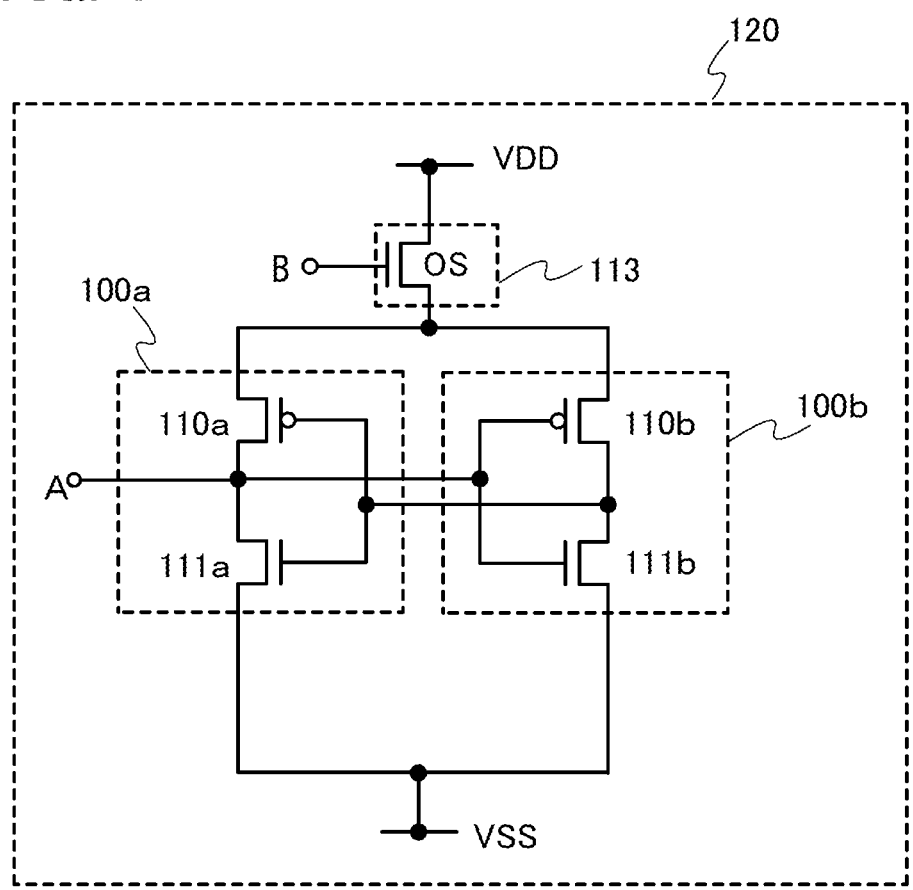
FIG. 4 is a diagram illustrating a semiconductor device in accordance with one embodiment of the present invention.

The low-potential power source for the inverter loop is referred to as VSS and the high-potential power source for the inverter loop is referred to as VDD. In FIG. 4, the OS transistor 113 is electrically connected between the inverter loop and VDD.

When the OS transistor 113 is turned off, the inverter loop of the holding circuit 120 is not supplied with power and thus does not operate. Therefore, as illustrated in FIG. 3, the on/off of the OS transistor 113 is controlled with use of a signal from the selection circuit 150, and thereby power consumption of the holding circuit 120 can be reduced in accordance with the state of the input-output terminal 130.

Figure 5:
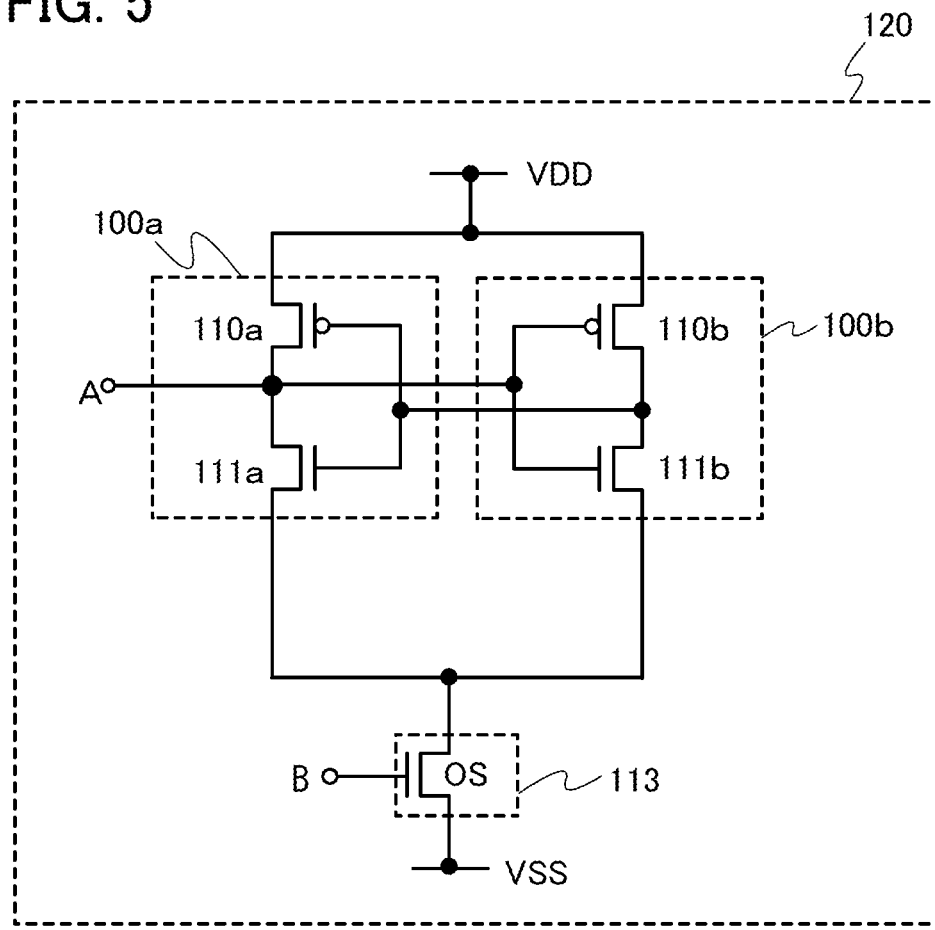
FIG. 5 is a diagram illustrating a semiconductor device in accordance with one embodiment of the present invention.

FIG. 5 illustrates another example of the holding circuit 120 that is different from that in FIG. 4. The different point between those in FIG. 4 and FIG. 5 is the OS transistor 113 is electrically connected between VSS (or GND) and the inverter loop.

The other structures in FIG. 5 are the same as those in FIG. 4. When the OS transistor 113 is turned off, the inverter loop of the holding circuit 120 is not supplied with power, and does not operate. Therefore, as illustrated in FIG. 3, the on/off of the OS transistor 113 is controlled with use of a signal from the selection circuit 150, and power consumption of the holding circuit 120 can be reduced in accordance with the state of the input-output terminal 130.

Because in FIG. 4 and FIG. 5, the OS transistor 113 is electrically connected to the power source such as VSS or VDD in series, the electrical connection with the power source can be controlled to stop power supply, thereby reducing power consumption.

In this manner, the semiconductor device of one embodiment of the present invention can save power as compared with a conventional device that is constantly supplied with power. Furthermore, the number of transistors to be controlled can be smaller than that of the structure of the inverter loop disclosed in Patent Document 1, and thereby the power consumption and the area can be reduced. Moreover, when the OS transistor is used, the current flowing when the OS transistor is off (off-state current) is still smaller than the off-state current flowing when the Si transistor is off. As a result, the OS transistor can contribute to low power consumption.

(Embodiment 2)

Figure 6:
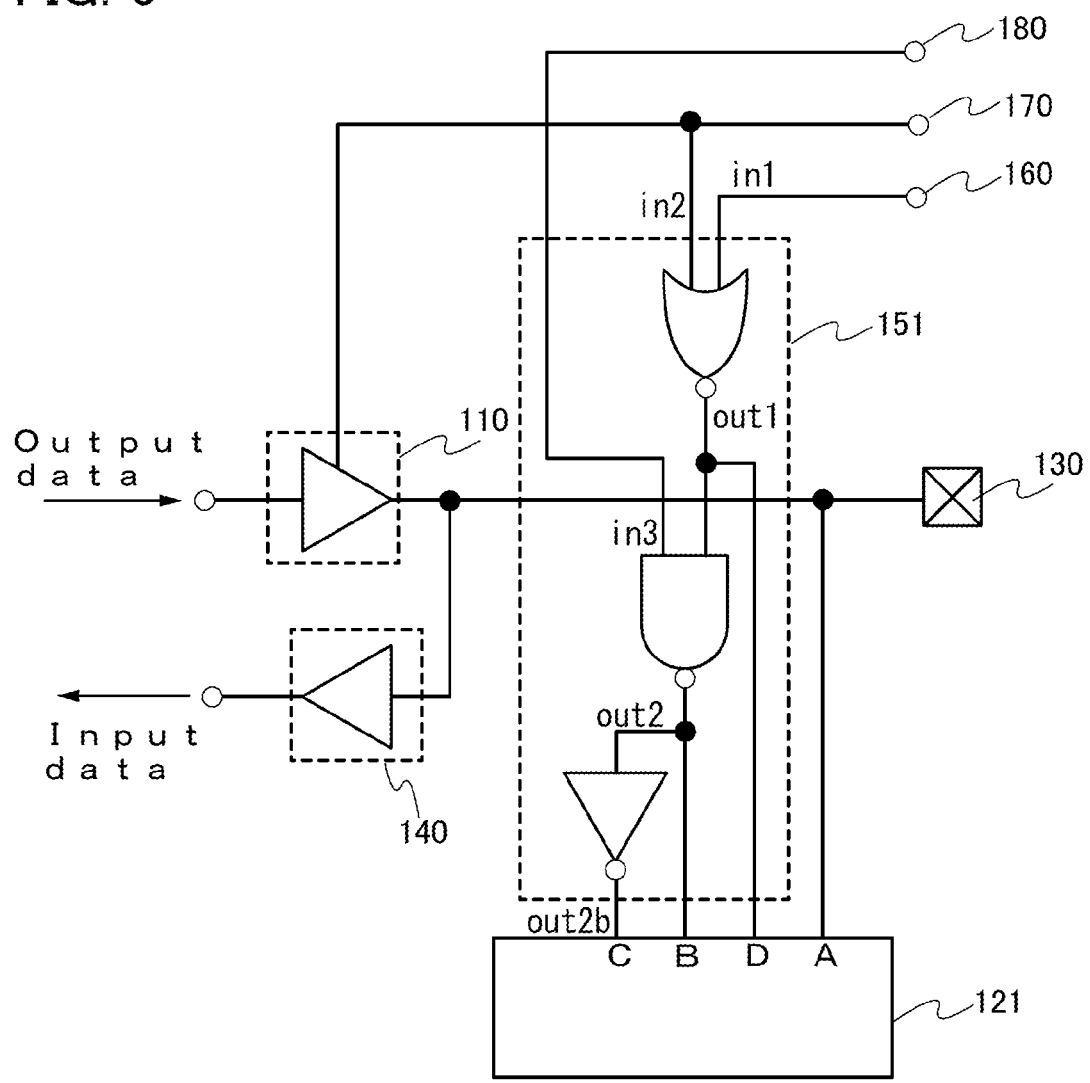
FIG. 6 is a diagram illustrating a semiconductor device in accordance with one embodiment of the present invention.

FIG. 6 illustrates another embodiment of the present invention. This embodiment includes the input-output terminal 130 and a holding circuit 121 that is electrically connected thereto. The terminal of the holding circuit 121 that is connected to the input-output terminal 130 is referred to as a terminal A. Furthermore, this embodiment includes the three-state buffer 110, the buffer circuit 140, and a selection circuit 151. The input-output terminal 130 is electrically connected to an output terminal of the three-state buffer 110 and an input terminal of the buffer circuit 140. The holding circuit 121 is electrically connected to the selection circuit 151. The terminals of the holding circuit 121 that are connected to the selection circuit 151 are referred to as terminals B, C, and D. The selection circuit 151 can include a NOR, a NAND, and an inverter. The entire circuit illustrated in FIG. 6 can be referred to as an input-output circuit.

The selection circuit 151 has a function of supplying a signal to stop power consumption by the holding circuit 121. To control the state of the input-output terminal 130, a signal to be supplied into the selection circuit 151 is used also as a control signal for the three-state buffer 110.

For example, the control signal 1 (in1) is input to the NOR from the terminal 160 and the control signal 2 (in2) is input to the NOR from the terminal 170. The control signal 2 (in2) is input also as a control signal for the three-state buffer 110. The output (out1) of the NOR is input to the terminal D of the holding circuit 121. In addition, the output (out1) of the NOR is also input to the NAND. A control signal 3 (in3) from a terminal 180 is input to the NAND. The output (out2) of the NAND is input to the terminal B of the holding circuit 121. In addition, the output (out2) of the NAND is input to the inverter. A signal (out2 b) inverted by the inverter is input to the terminal C of the holding circuit 121.

Table 2 is a truth table of the selection circuit 151 based on the combination of Hi(1) and Lo(0) of the signal 1 (in1), the control signal 2 (in2), and the control signal 3 (in3). As seen in Table 2, the input-output circuit including the holding circuit can have four states excluding a forbidden state. In Table 2, "in1" is the control signal 1 input to the selection circuit 151 from the terminal 160, "in2" is the control signal 2 input to the selection circuit 151 from the terminal 170, and "in3" is the control signal 3 input to the selection circuit 151 from the terminal 180. Specifically, the control signals 1 and 2 are input to the NOR in the selection circuit 151 and the control signal 3 is input to the NAND in the selection circuit 151. "Out1" is a signal output from the NOR, the "out2" is a signal output from the NAND, and the "out2 b" is an inversion signal of the "out2" by the inverter. The signal "out1" output from the selection circuit 151 is input to the terminal D of the holding circuit 121, and the signal "out2" is input to the terminal B, and the signal "out2 b" is input to the terminal C. The control signal 2 is used also as the control signal for the three-state buffer 110.

TABLE 2

| | | | | | | Input-output circuit | | |
|---|---|---|---|---|---|---|---|---|
| in1 | in2 | in3 | out1 | out2 | out2b | Input-output terminal 130 | Holding circuit 121 | Remarks |
| 0 | 0 | 0 | 1 | 1 | 0 | Non-use | Use | |
| 0 | 0 | 1 | 1 | 0 | 1 | Non-use | Non-use | With resistor |
| 0 | 1 | 0 | 0 | 1 | 0 | Forbidden | — | |
| 0 | 1 | 1 | 0 | 1 | 0 | Forbidden | — | |
| 1 | 0 | 0 | 0 | 1 | 0 | Input | Non-use | |

TABLE 2-continued

| | | | | | | Input-output circuit | | |
|---|---|---|---|---|---|---|---|---|
| in1 | in2 | in3 | out1 | out2 | out2b | Input-output terminal 130 | Holding circuit 121 | Remarks |
| 1 | 0 | 1 | 0 | 1 | 0 | Input | Non-use | |
| 1 | 1 | 0 | 0 | 1 | 0 | Output | Non-use | |
| 1 | 1 | 1 | 0 | 1 | 0 | Output | Non-use | |

Switching whether the input-output terminal 130 functions as the input terminal, functions the output terminal, or is not used can be conducted based on the control signal 1, the control signal 2, and the control signal 3 as in Table 2 above.

A case where the input-output terminal 130 is not used and the holding circuit 121 is used is described. At this time, the control signal 1 (in1), the control signal 2 (in2), and the control signal 3 (in3) are "0" and the out1 is "1", the out2 is "1", and the out2 b is "0". Signals "1", "1", and "0" are input to the terminals D, B, and C, respectively, of the holding circuit 120. As the switches electrically connected to the terminals B and D, switches that are turned on based on the signal "1" are used. As the switch electrically connected to the terminal C, a switch that is turned off based on the signal "0" is used.

In addition, as the control signal for the three-state buffer 110, "0" is input and thus the output of the three-state buffer 110 takes high impedance and is separated from the input-output terminal 130. The input-output terminal 130 is electrically connected to the buffer circuit 140, and is controlled not to be supplied with another circuit electrically connected to the buffer circuit 140 or a programme. In this manner, the input-output terminal 130 can be brought into the non-use state.

The input-output terminal 130 is electrically connected to the terminal A. Therefore, a potential of the input-output terminal 130 is supplied to the inverter loop of the holding circuit 121 through the terminal A. Furthermore, the switches electrically connected to the terminals B and D are on as described above; therefore, the potential of the input-output terminal 130 can be maintained by the inverter loop of the holding circuit 121.

In this manner, when the input-output terminal 130 is not used, the final potential of the input-output terminal 130 is supplied to the inverter loop of the holding circuit 120, and the potential is kept constant. As seen in Table 2, the holding circuit 121 is used.

As seen in the second row in Table 2 is described a case where the potential of the input-output terminal 130 is maintained in response to the signal "out2 b" even when the input-output terminal 130 is not used and the inverter loop of the holding circuit 121 is not supplied with power and does not operate. In this case, when the control signal 1 (in1) and the control signal 2 (in2) are "0" and the control signal 3 (in3) is "1", "out1" is "1", "out2" is "0", and "out2 b" is "1". This case is different from the above-described case in that the control signal 3 (in3) is "1", and as a result, "out2" is "1", "out2 b" is"0". Thus, the switch electrically connected to the terminal B is turned off, and the switch electrically connected to the terminal C is turned on. Because the switch electrically connected to the terminal B is off, the inverter loop electrically connected to the terminal B is not supplied with a signal. Therefore, because the inverter loop is not supplied with power, shoot-through current does not flow and thus power consumption can be reduced.

The terminal C is electrically connected to an element (for example a resistor) and the switch electrically connected to the terminal D is turned on, and thus the potential of the input-output terminal 130 can be maintained as a potential of the element (for example a resistor). With the resistor, the potential of the input-output terminal 130 can be VSS or VDD. The resistor in the former case is referred to as a pull-down resistor and the resistor in the latter case is referred to as a pull-up resistor.

The control signal for the three-state buffer 110 is "0" in a manner similar to the above-described state, and the input-output terminal 130 can be in a non-use state.

As seen in the third or fourth row in Table 2, when the control signal 1 (in1) is "0", the control signal 2 (in2) is "1", and the control signal 3 (in3) is "1" or "0", an output state is selected even though the input-output circuit is not selected. For that reason, this state is forbidden.

A case where the input-output terminal 130 shown in the fifth or sixth row in Table 2 functions as an input terminal is described. In this case, when the control signal 1 (in1) is "1" and the control signal 2 (in2) is "0", "out1" is "0", "out2" is "1", and "out2 b" is "0" regardless of the control signal 3 (in3). The switch electrically connected to the terminal D of the holding circuit 121 is turned off, the switch electrically connected to the terminal B of the holding circuit 121 is turned on, and the switch electrically connected to the terminal C of the holding circuit 121 is turned off. In addition, as the control signal for the three-state buffer 110, "0" is input and the output of the three-state buffer 110 takes high impedance, so that the connection between the three-state buffer 110 and the input-output terminal 130 is separated. Thus, the input-output terminal 130 is electrically connected to the buffer circuit 140, and thus a signal can be input by another circuit electrically connected to the buffer circuit 140 or a programme. In this manner, the input-output terminal 130 can function as an input terminal.

At this time, the potential of the input-output terminal 130 is a potential of an input signal, and thus the potential of the input-output terminal 130 is not required to be maintained by the holding circuit 121, so that the holding circuit 121 is not used.

In this period, in order not to use the holding circuit 121, at least the switch electrically connected to the terminal D is turned off. Because power is not supplied to the inverter loop electrically connected to the input-output terminal 130 via the switch, shoot-through current does not flow and power consumption can be reduced. Therefore, power saving in the holding circuit 121 can be achieved.

In addition, the switch electrically connected to the terminal C is also turned off according to the truth table in Table 2, and thus, the electrical connection between the input-output terminal 130 and the element (for example, a resistor) is separated by the switch.

In this manner, the input-output terminal 130 can function as an input terminal.

A case where the input-output terminal 130 shown in the seventh or eighth row in Table 2 functions as an output terminal is described. In this case, when the control signal 1 (in1) and the control signal 2 (in2) are "1", "out1" is "0", "out2" is "1", and "out2 b" is "0" regardless of the control signal 3 (in3). The switch electrically connected to the terminal D of the holding circuit 121 is turned off, the switch electrically connected to the terminal B of the holding circuit 121 is turned on, and the switch electrically connected to the terminal C of the holding circuit 121 is turned off. In addition, because "1" is input as the control signal for the three-state buffer 110, the output of the three-state buffer 110 and the input-output terminal 130 are electrically connected to each other, and a signal cannot be supplied to the input-output terminal 130 side by another circuit electrically connected to the buffer circuit 140 or a programme. In this manner, the input-output terminal 130 can function as an output terminal.

At this time, the potential of the input-output terminal 130 is a potential of an output signal, and thus the potential of the input-output terminal 130 is not required to be maintained by the holding circuit 121, so that the holding circuit 121 is not used.

In this period, in order not to use the holding circuit 121, at least the switch electrically connected to the terminal D is turned off. Because power is not supplied to the inverter loop electrically connected to the input-output terminal 130 via the switch, shoot-through current does not flow and power consumption can be reduced. Therefore, power saving in the holding circuit 121 can be achieved.

In addition, the switch electrically connected to the terminal C is also turned off according to the truth table in Table 2, and thus, the electrical connection between the input-output terminal 130 and the element (for example, a resistor) is separated by the switch.

In this manner, the input-output terminal 130 can function as an input terminal.

As described above, the holding circuit 121 can be in a non-use state in accordance with the state of the input-output terminal 130, and thus waste power consumption can be prevented. Furthermore, the input-output terminal 130 can be electrically connected to a resistor and the potential of the input-output terminal 130 can be maintained at a potential other than the final potential.

The example where the selection circuit 151 includes the NOR, the NAND, and the inverter has been described here, but the structure of the selection circuit 151 is not limited to this example. Any circuit that can select each state in response to the control signal 1, the control signal 2, and the control signal 3 as seen in Table 2 can be used.

In addition, the input-output terminal 130 may be electrically connected to a protection circuit. The protection circuit includes a resistor, a diode, or the like.

Examples of the holding circuit 121 enabling the above operation are shown. In the holding circuit 121 illustrated in FIG. 7, the switches electrically connected to the terminals B, C, and D are first to third OS transistors 171 to 173. For the structures of the first inverter 100a and the second inverter 100b, refer to the embodiment described above.

Figure 7:
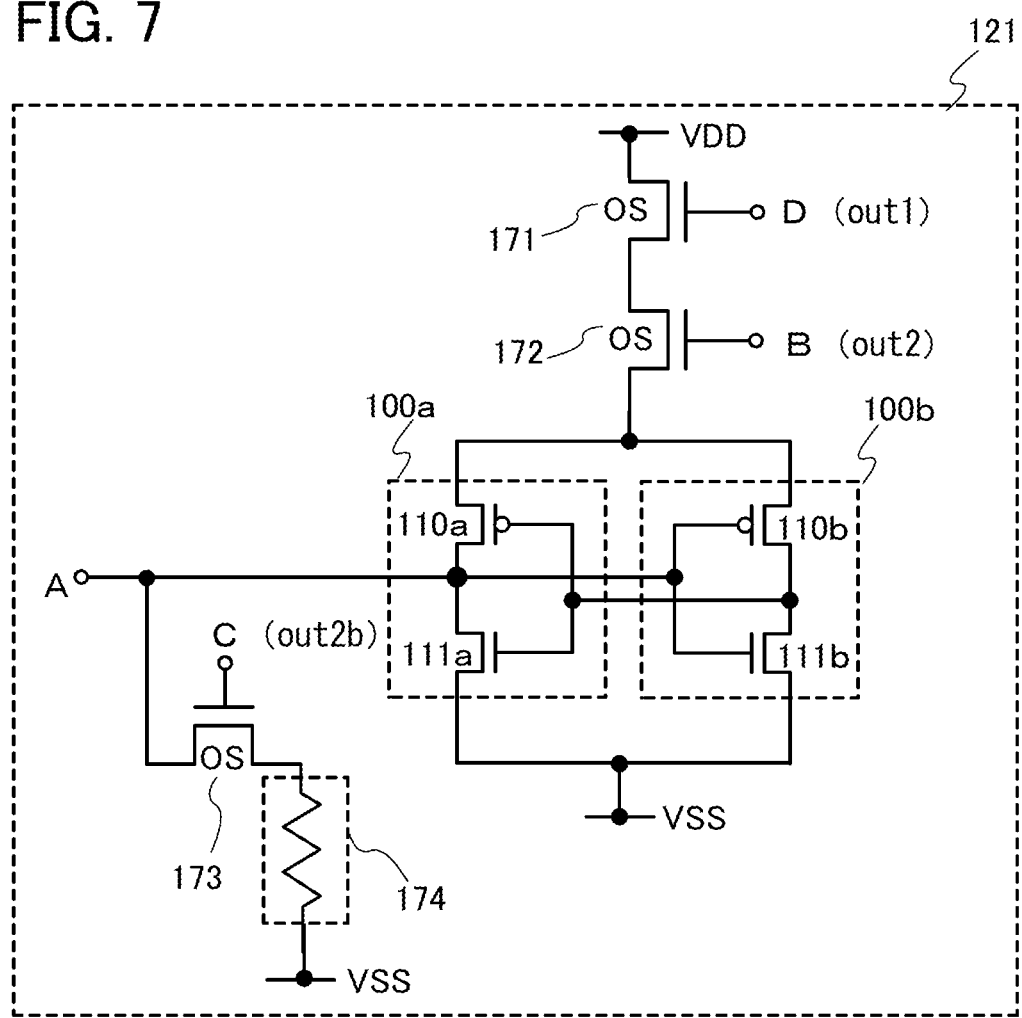
FIG. 7 is a diagram illustrating a semiconductor device in accordance with one embodiment of the present invention.

In FIG. 7, the first OS transistor 171 and the second OS transistor 172 are electrically connected between VDD and the inverter loop. The terminal A is electrically connected to a first resistor 174 via the third OS transistor 173. As the first resistor 174, a pull-down resistor can be used, and a state where the input-output terminal 130 is electrically connected to the first resistor 174 (pull-down resistor) can be selected. For the components common to those in FIG. 4, refer to the embodiment described above.

Figure 8:
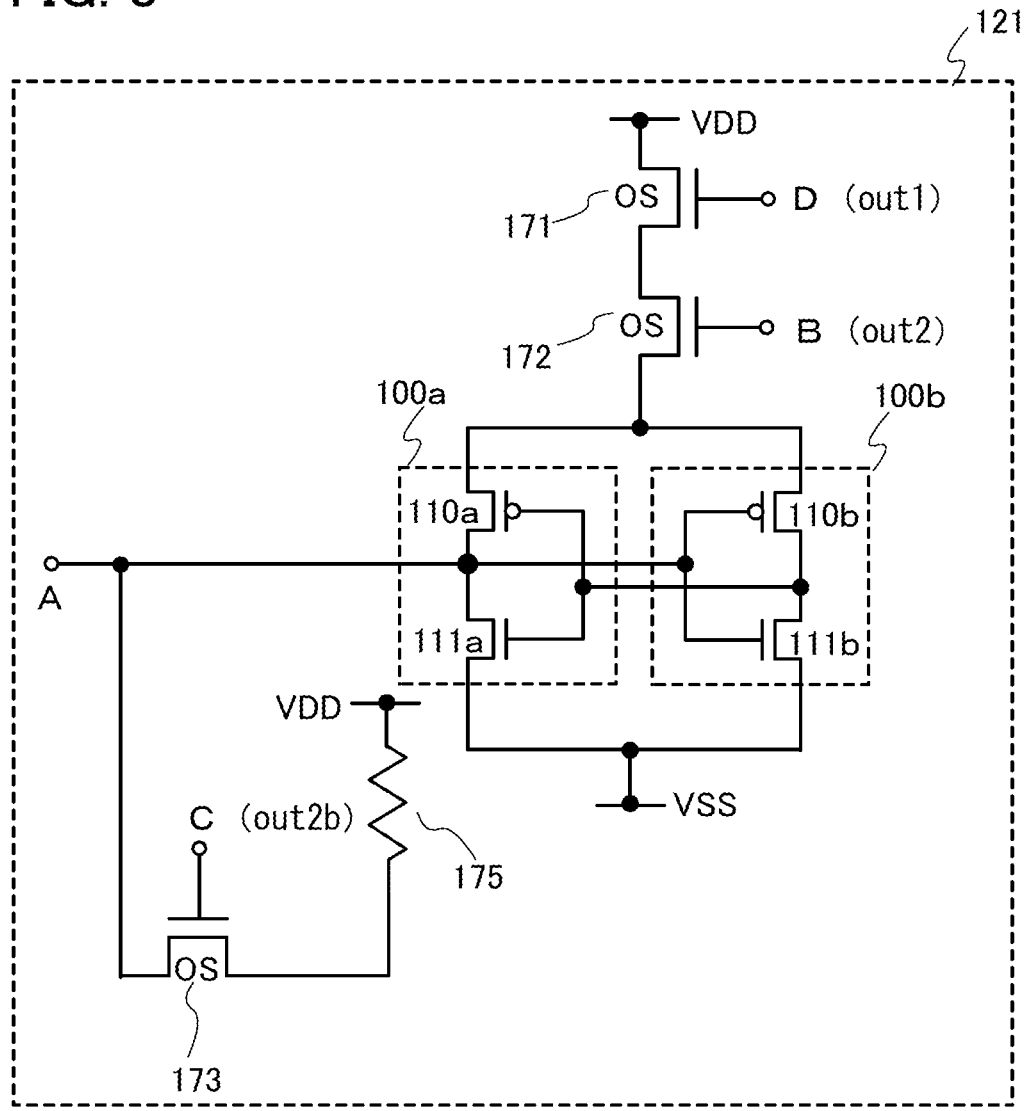
FIG. 8 is a diagram illustrating a semiconductor device in accordance with one embodiment of the present invention.

In FIG. 8, the first OS transistor 171 and the second OS transistor 172 are electrically connected between VDD and the inverter loop. The terminal A is electrically connected to a second resistor 175 via the third OS transistor 173. As the second resistor 175, a pull-up resistor can be used, and a state where the input-output terminal 130 is electrically connected to the first resistor 175 (pull-up resistor) can be selected. For the components common to those in FIG. 4, refer to the embodiment described above.

Figure 9:
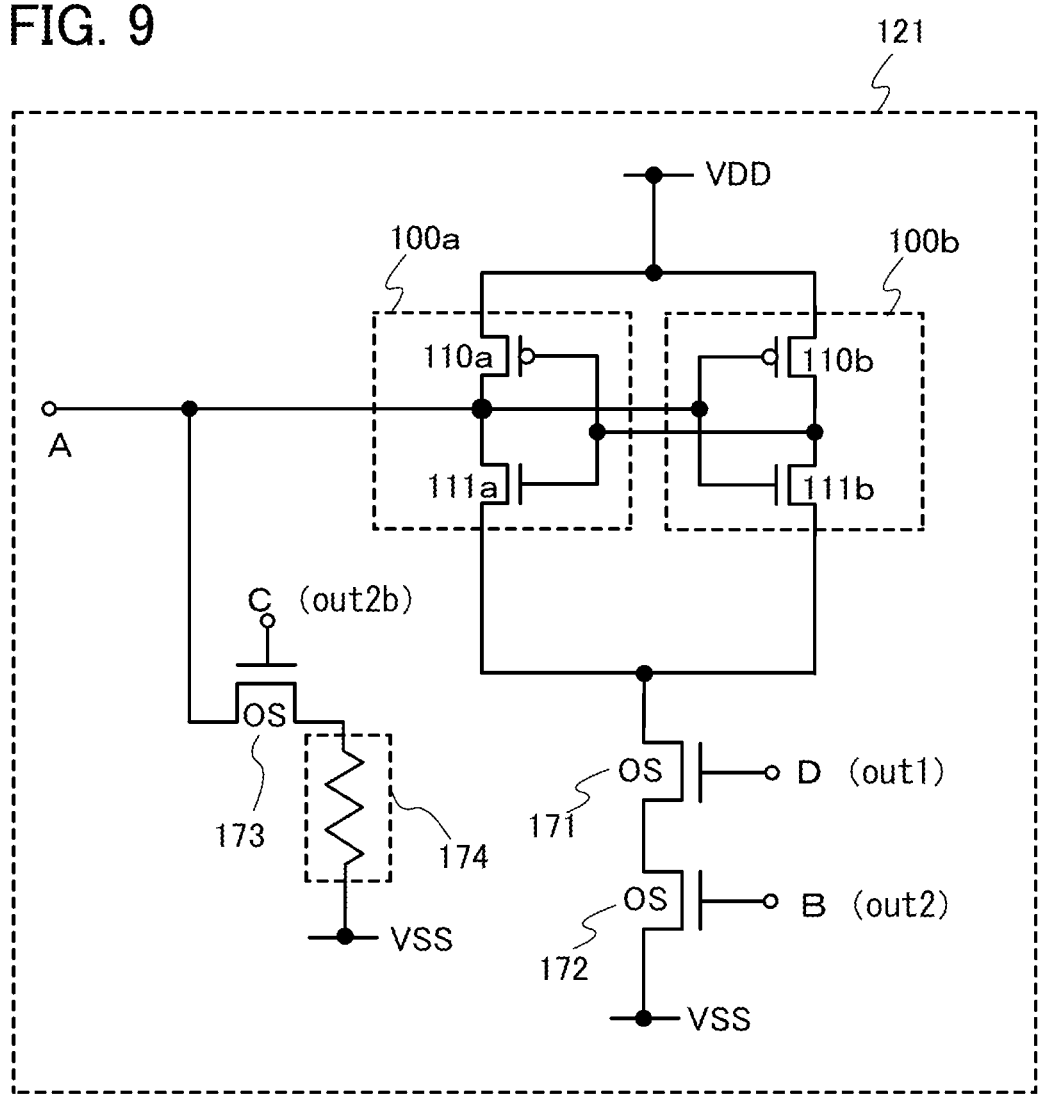
FIG. 9 is a diagram illustrating a semiconductor device in accordance with one embodiment of the present invention.

In FIG. 9, the first OS transistor 171 and the second OS transistor 172 are electrically connected between VSS and the inverter loop. The terminal A is electrically connected to a first resistor 174 via the third OS transistor 173. As the first resistor 174, a pull-down resistor can be used, and a state where the input-output terminal 130 is electrically connected to the first resistor 174 (pull-down resistor) can be selected. For the components common to those in FIG. 5, refer to the embodiment described above.

Figure 10:
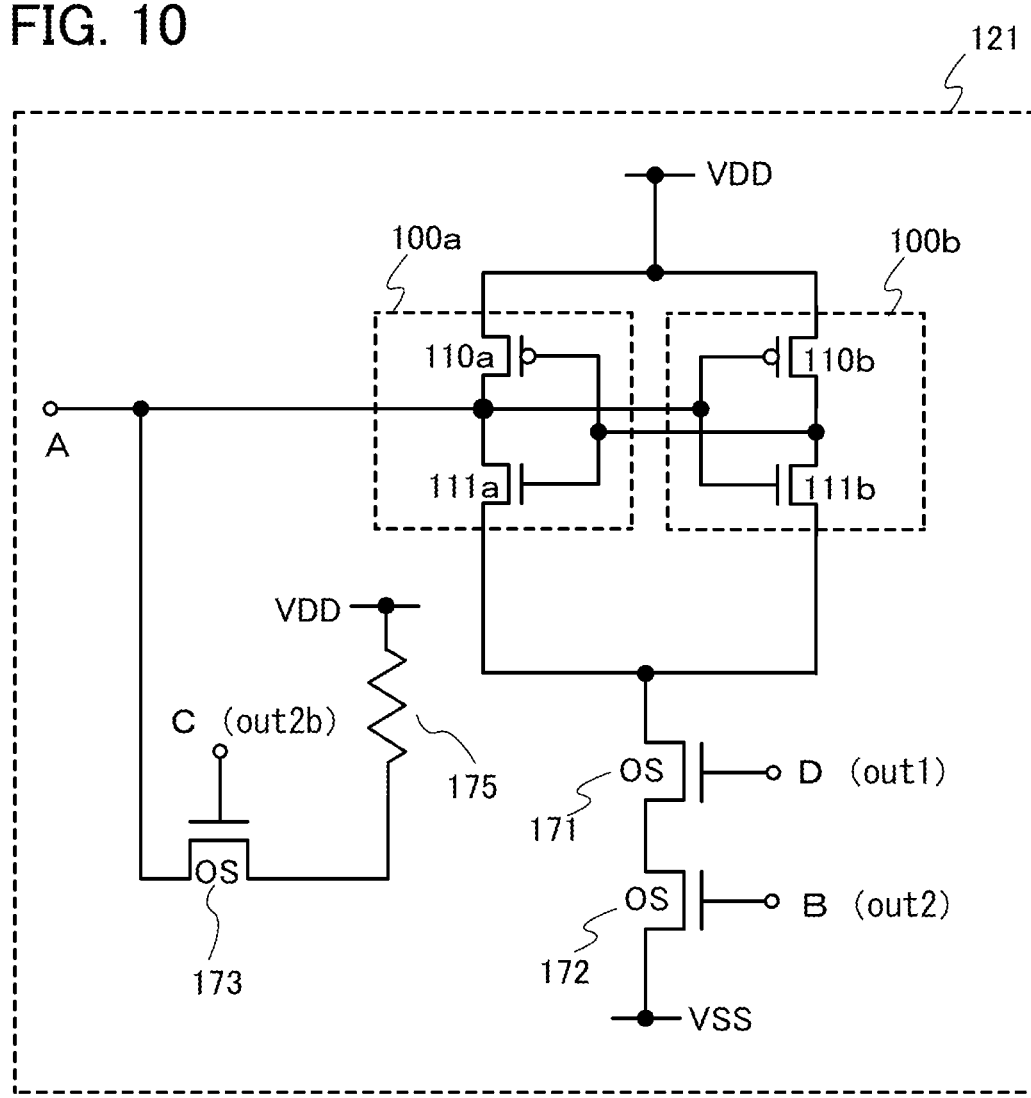
FIG. 10 is a diagram illustrating a semiconductor device in accordance with one embodiment of the present invention.

In FIG. 10, the first OS transistor 171 and the second OS transistor 172 are electrically connected between VSS and the inverter loop. The terminal A is electrically connected to the second resistor 175 via the third OS transistor 173. As the second resistor 175, a pull-up resistor can be used, and a state where the input-output terminal 130 is electrically connected to the first resistor 175 (pull-up resistor) can be selected. For the components common to those in FIG. 5, refer to the embodiment described above.

In FIG. 7 to FIG. 10, the first and the second OS transistors 171 and 172 are electrically connected to the power source such as VSS or VDD in series, the electrical connection with the power source can be controlled to stop power supply, thereby reducing power consumption.

In this manner, the semiconductor device of one embodiment of the present invention can save power as compared with a conventional device that is constantly supplied with power. Moreover, when the OS transistor is used, the current flowing when the OS transistor is off (off-state current) is still smaller than the off-state current flowing when the Si transistor is off. As a result, the OS transistor contributes to low power consumption. Furthermore, a pull-down resistor or a pull-up resistor can be selected in this embodiment, which is different from in the embodiment described above.

(Embodiment 3)

Figure 11:
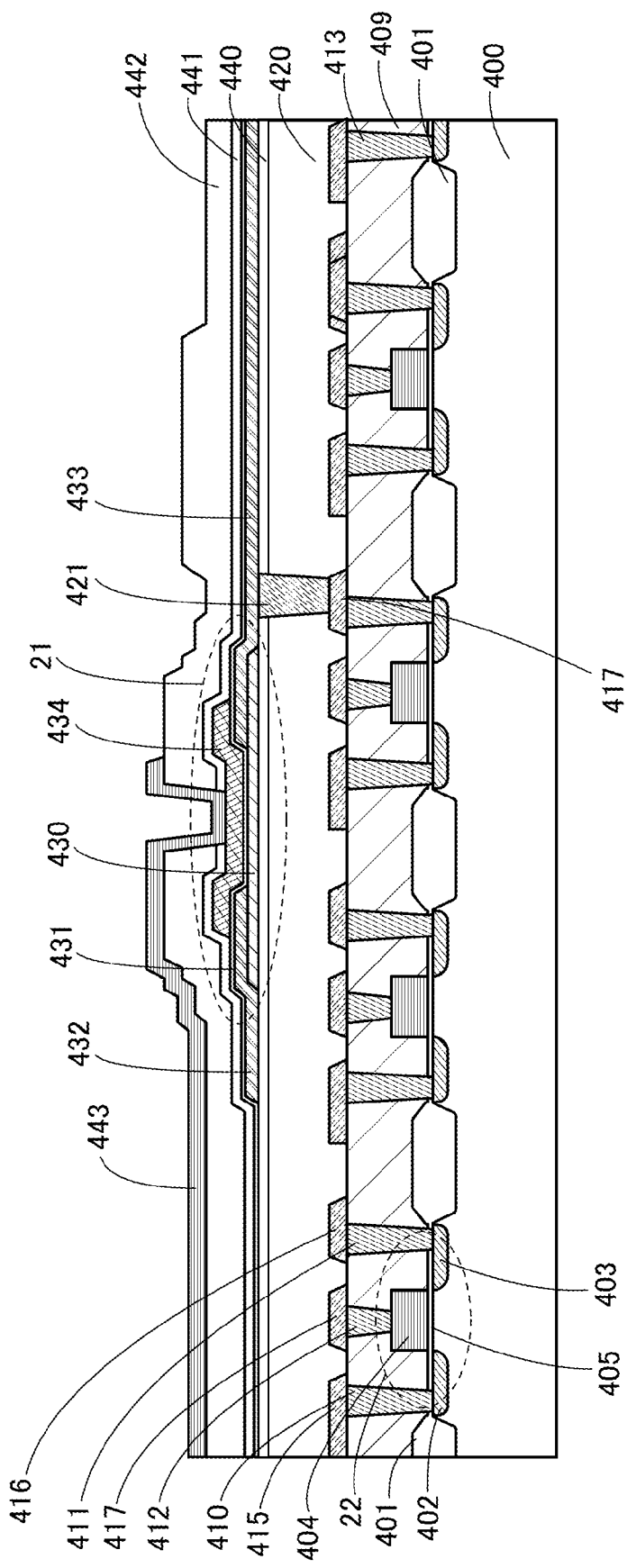
FIG. 11 is a diagram illustrating a semiconductor device in accordance with one embodiment of the present invention.

FIG. 11 illustrates a cross-sectional structure example of the holding circuit in accordance with one embodiment of the present invention. In FIG. 11, the transistor 21 including a channel formation region in an oxide semiconductor film is formed over the transistor 22 including a channel formation region in a single crystal silicon substrate. The transistor 21 is an OS transistor that can be used at least as a first switch of the holding circuit 120, and first to third switches of the holding circuit 121. The transistor 22 is a Si transistor that can be used at least for the first and the second inverters of the holding circuits 120 and 121.

Note that the transistor 22 can include a semiconductor film of silicon, germanium, or the like in an amorphous, microcrystalline, polycrystalline, or single crystal state for an active layer. This is referred to as the Si transistor.

Alternatively, the transistor 22 may include a channel formation region in an oxide semiconductor film. When all transistors have a channel formation region formed of an oxide semiconductor, the transistor 21 is not necessarily formed over the transistor 22. The transistor 21 and the transistor 22 can be formed in the same layer and the number of manufacturing steps can be reduced.

In the case where the transistor 22 is formed using a silicon thin film, any of the following can be used: amorphous silicon formed by sputtering or vapor phase growth such as plasma CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 400 where the transistor 22 is formed can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate).

Based on the above description, FIG. 11 illustrates an example where a Si transistor is formed using a single crystal silicon substrate having n-type conductivity.

The transistor 22 is electrically isolated from another transistor by an element isolation insulating film 401 as illustrated in FIG. 11. The element isolation insulating film 401 can be formed by a local oxidation of silicon (LOCOS) method, a trench isolation method, or the like.

Specifically, the transistor 22 includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps with a channel formation region formed between the impurity regions 402 and 403 with the gate insulating film 405 interposed therebetween.

An insulating film 409 is provided over the transistor 22. Openings 413 are formed to penetrate the insulating film 409. A wiring 410 in contact with the impurity region 402, a wiring 411 in contact with the impurity region 403, and a wiring 412 electrically connected to the gate electrode 404 are formed in the openings 413.

The wiring 410 is electrically connected to a wiring 415 formed over the insulating film 409. The wiring 411 is electrically connected to a wiring 416 formed over the insulating film 409. The wiring 412 is electrically connected to a wiring 417 formed over the insulating film 409.

An insulating film 420 and an insulating film 440 are stacked in this order over the wirings 415 to 417. Either the insulating film 420 or the insulating film 440 may be formed. An opening is formed in the insulating film 420 and the insulating film 440, and in the opening, a wiring 421 electrically connected to the wiring 417 is formed.

In FIG. 11, the transistor 21 is formed over the insulating film 440. The transistor 21 is an OS transistor.

The transistor 21 includes, over the insulating film 440, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that is positioned over the gate insulating film 431 and overlaps with the semiconductor film 430 between the conductive films 432 and 433. Note that the conductive film 433 is electrically connected to the wiring 421.

An insulating film 441 and an insulating film 442 are stacked in this order over the transistor 21. Either the insulating film 441 or the insulating film 442 may be formed. An opening is formed in the insulating films 441 and 442. A conductive film 443 that is in contact with the gate electrode 434 in the opening is provided over the insulating film 441.

Figure 12:
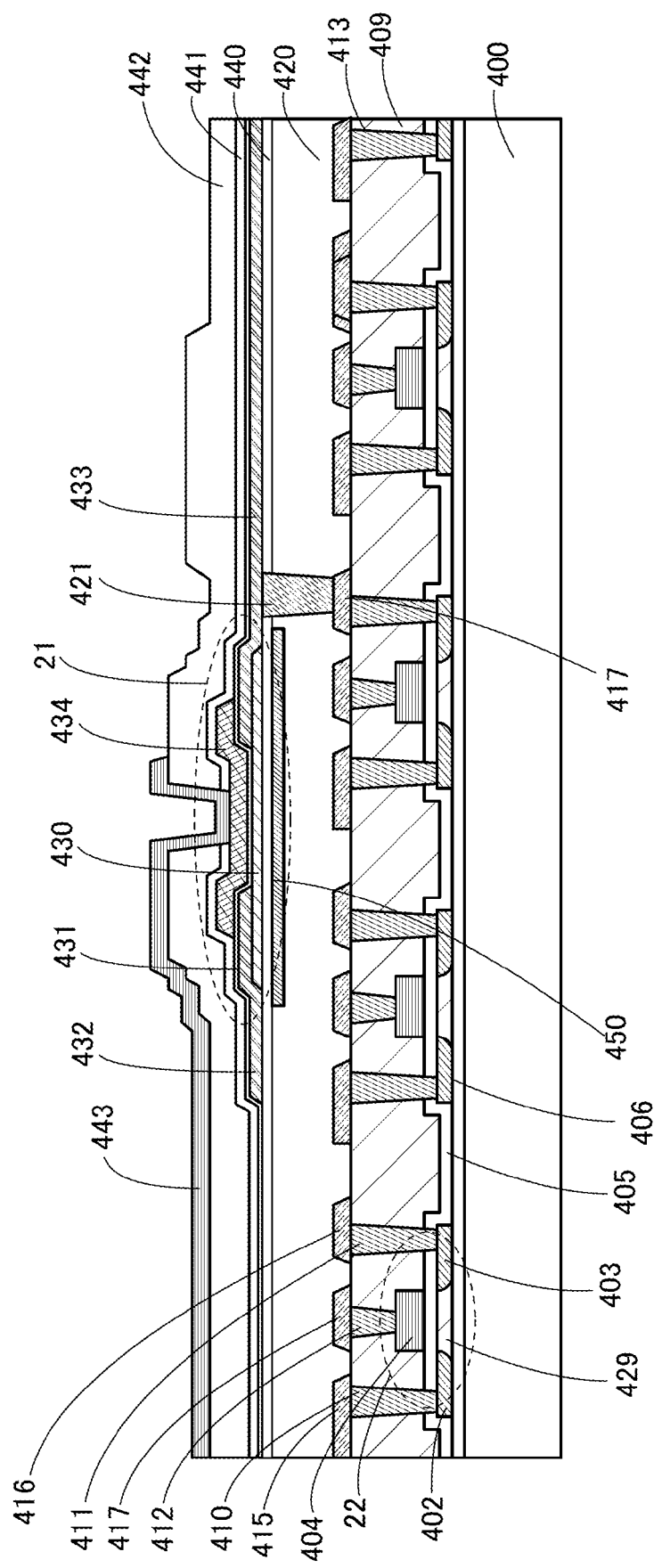
FIG. 12 is a diagram illustrating a semiconductor device in accordance with one embodiment of the present invention.

Note that in FIG. 11, the transistor 21 includes one gate electrode 434 on at least either the upper side or the lower side of the semiconductor film 430. Alternatively, the transistor 21 may include a pair of gate electrodes on the upper and lower sides of the semiconductor film 430 with the semiconductor film 430 interposed therebetween. In FIG. 12, instead of the first gate electrode 404, the second gate electrode 450 is formed. The transistor 21 includes the second gate electrode 450 on the lower side of the semiconductor film 430 and the first gate electrode 404 on the upper side of the semiconductor film 430.

When the transistor 21 includes a pair of the first gate electrode 434 and the second gate electrode 450 with the semiconductor film 430 interposed therebetween, a signal for controlling a conduction state or a non-conduction state may be supplied to one of the gate electrodes, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled. For example, a signal for controlling the conduction state and the non-conduction state can be supplied to the first gate electrode 434 and a signal for controlling the threshold voltage can be supplied to the second gate electrode 450.

In FIG. 11, the transistor 21 has a single-gate structure where one channel formation region corresponding to one gate electrode 434 is provided. However, the transistor 21 may have a multi-gate structure in which a plurality of channel formation regions are included in one active layer.

The transistor in FIG. 12 is different from that in FIG. 11 in other components below. In FIG. 12, an insulating film 406 is formed over the semiconductor substrate 400. The transistor 22 includes an island-like semiconductor film 429 over the insulating film 406. The island-like semiconductor film 429 may have a crystal structure, e.g., a single crystal or a polycrystalline structure. The gate insulating film 405 and the like formed over the island-like semiconductor film 429 are the same as those in FIG. 11.

Figure 13A:
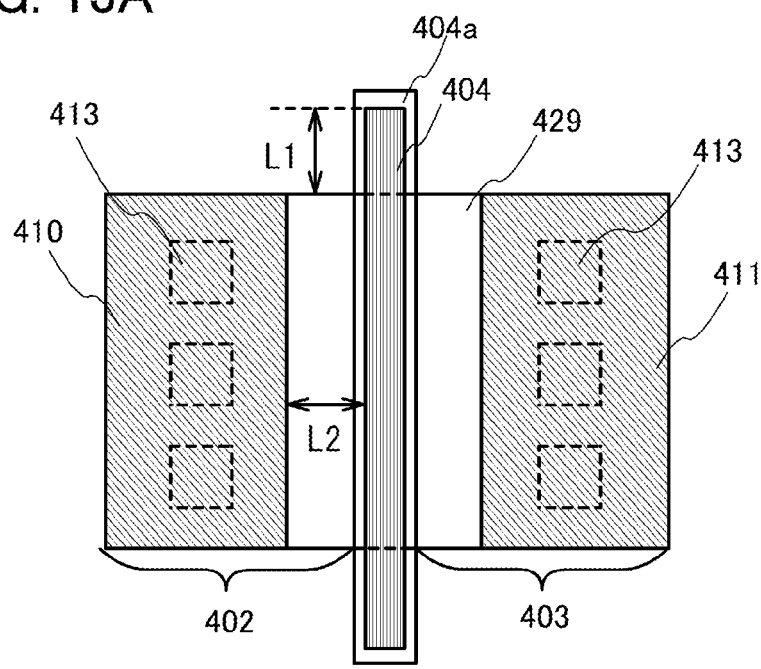
FIGS. 13A and 13B are diagrams each illustrating a semiconductor device in accordance with one embodiment of the present invention.
Figure 13B:
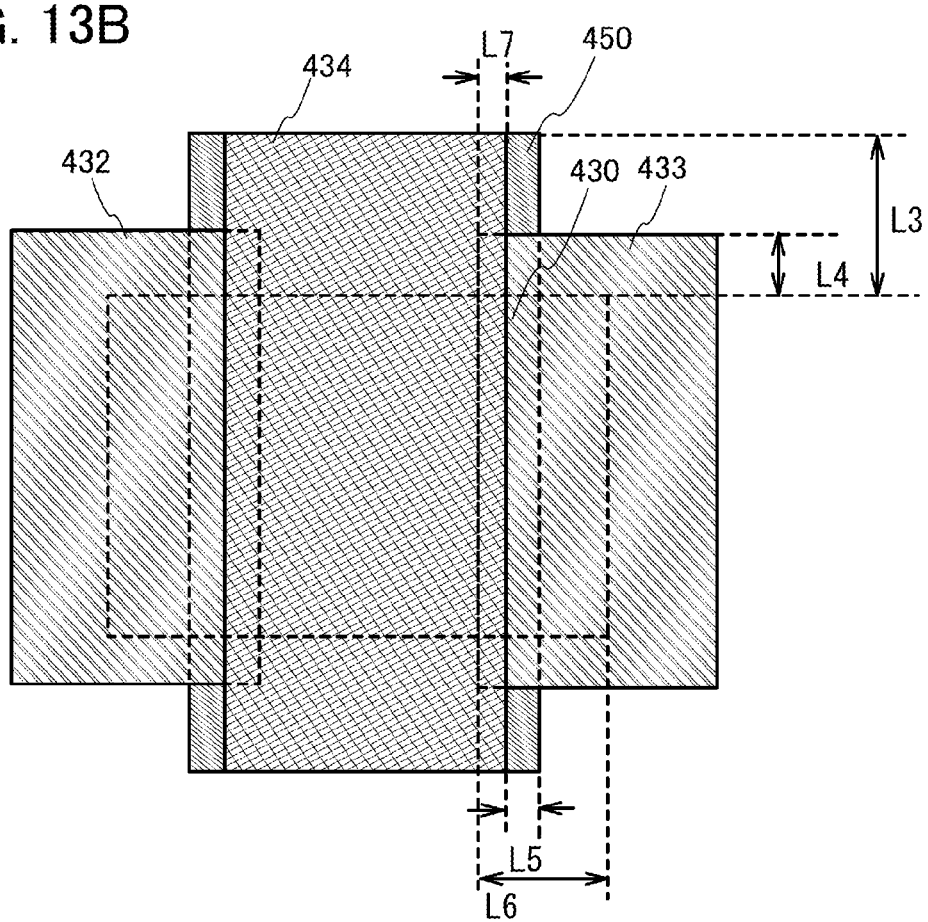

FIG. 13A illustrates a top view of the transistor 22 in FIG. 12, and FIG. 13B illustrates a top view of the transistor 21 in FIG. 12. As illustrated in FIG. 13A, the transistor 22 includes the island-like semiconductor film 429 and the gate electrode 404. Although not illustrated in FIG. 12, the gate electrode 404 may be covered with an insulating film 404a called sidewall. A plurality of openings 413 where the wirings 410 are formed are provided in the impurity region 402 and a plurality of openings 413 where the wirings 411 are formed are provided in the impurity region 403.

In the channel-formation region in the island-like semiconductor film 429, the channel length in the carrier flow direction is from 0.35 μm to 0.95 μm, inclusive. The channel width (W) intersecting with the channel length (L) is two to ten times as large as the channel length. In the channel width direction, the gate electrode 404 extends from an end of the island-like semiconductor film 429. The length (L1) of the region where the gate electrode 404 extends is from 0.3 μm to 1.0 μm, inclusive. In the channel length direction, the wiring 410 is apart from the gate electrode 404, the wiring 411 is apart from the gate electrode 404, and the island-like semiconductor film 429 can have a pair of LDD regions. For example, the distance (L2) between the wiring 410 and the gate electrode 404 is preferably shorter than the length (L1) of the region where the gate electrode 404 extends.

As illustrated in FIG. 13B, the transistor 21 includes the second gate electrode 450, the semiconductor film 430, the conductive film 432, the conductive film 433, and the first gate electrode 434. In a channel formation region of the semiconductor film 430, the channel length in the carrier flow direction is from 0.8 μm to 1.5 μm, inclusive. The channel width (W) intersecting with the channel length (L) is one to three times as large as the channel length.

The transistor 21 and the transistor 22 can be formed separately, and the channel length and the channel width in the channel formation region of the OS transistor are not limited by the arrangement of the Si transistor. Therefore, the channel length of the transistor 21 can be made larger than the channel length of the transistor 22. The transistors 22 having a short channel length can be arranged with a higher degree of integration than that of the transistors 21.

The second gate electrode 450 has a region that extends from an end of the semiconductor film 430. The length of the extending region of the second gate electrode 450 is L3. The length (L3) is from 0.2 µm to 1.0 µm, inclusive. In a similar manner, the first gate electrode 434 also has a region that extends from the end of the semiconductor film 430 and the length of the region is L3

The conductive film 432 has a region that extends from the end of the semiconductor film 430 and the conductive film 433 has a region that extends from the end of the semiconductor film 430. The length of the regions is L4. The length (L4) is from 0.2 µm to 1.1 µm, inclusive. The length (L4) is preferably shorter than the length (L3).

The area in the channel length direction of the second gate electrode 450 is larger than that of the first gate electrode 434. The length of the area in the channel length direction where the second gate electrode 450 is larger than the first gate electrode 434 is L5. The length (L5) is from 0.1 µm to 0.5 µm, inclusive.

The semiconductor film 430 has a region overlapping with the conductive film 432 or the conductive film 433. The length of the region of the semiconductor film 430 overlapping with the conductive film 432 or the conductive film 433 is L6. The length (L6) is from 0.4 µm to 1.0 µm, inclusive.

The conductive film 432 has a region overlapping with the first gate electrode 434 and the conductive film 433 has a region overlapping with the first gate electrode 434. The length of the regions of the conductive films 432 and 433 overlapping with the first gate electrode 434 is L7. The length (L7) is from 0.2 µm to 0.8 µm, inclusive.

<Semiconductor Film of OS Transistor>

A highly-purified oxide semiconductor (purified OS) obtained by reduction of impurities such as moisture or hydrogen that serves as an electron donor (donor) and by reduction of oxygen defects can be an intrinsic (i-type) semiconductor or a substantially i-type semiconductor. For this reason, a transistor having a channel formation region in a highly purified oxide semiconductor film can have extremely small off-state current, leading to improvement of the reliability of the OS transistor.

Specifically, various experiments can prove a small off-state current of a transistor having a channel formation region in a highly purified oxide semiconductor film. For example, according to an experiment result, even when an element has a channel width of $1 \times 10^6$ µm and a channel length of 10 µm, off-state current can be less than or equal to the measurement limit of a semiconductor parameter analyzer, i.e., less than or equal to $1 \times 10^{-13}$ A at voltage (drain voltage) between the source electrode and the drain electrode of from 1 V to 10 V. In that case, it can be seen that off-state current standardized on the channel width of the transistor is lower than or equal to 100 zA/µm. Further, in an experiment, the off-state current was measured with the use of a circuit in which a capacitor and a transistor are connected to each other and charge that flows in or out from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it was found that, in the case where the voltage between the source electrode and the drain electrode of the transistor is 3 V, a much lower off-state current of several tens of yA/µm is obtained. Accordingly, it is found that the transistor including the highly-purified oxide semiconductor film in the channel formation region has much lower off-state current than a crystalline silicon transistor.

Unless otherwise specified, in this specification, the off-state current of an n-channel transistor is a current that flows between a source and a drain when the potential of a gate is lower than or equal to 0 with the potential of the source as a reference potential while the potential of the drain is higher than those of the source and the gate. Moreover, in this specification, the off-state current of a p-channel transistor is a current that flows between a source and a drain when the potential of a gate is higher than or equal to 0 with the potential of the source as a reference potential while the potential of the drain is lower than those of the source and the gate.

In the case where an oxide semiconductor film is used as the semiconductor film, at least indium (In) or zinc (Zn) is preferably included as an oxide semiconductor. The oxide semiconductor preferably contains, in addition to In and Zn, gallium (Ga) serving as a stabilizer that reduces variations in electric characteristics of the transistor using the oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

An oxide semiconductor such as an In—Ga—Zn-based oxide or an In—Sn—Zn-based oxide has an advantage of high mass productivity because a transistor with excellent electrical characteristics can be formed by depositing the oxide semiconductor by a sputtering method or a wet process, unlike silicon carbide, gallium nitride, or gallium oxide. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn and there is no particular limitation on the ratio of In:Ga:Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to any of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or an oxide with an atomic ratio close to any of the above atomic ratios can be used.

For example, with an In—Sn—Zn-based oxide, high mobility can be realized relatively easily. However, even with an In—Ga—Zn-based oxide, mobility can be increased by reducing the defect density in the bulk.

An oxide semiconductor film may be in a non-single-crystal state, for example. The non-single-crystal state is, for example, structured by at least one of c-axis aligned crystal (CAAC), polycrystalline, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned and a-axes and/or b-axes are not macroscopically aligned with an XRD measurement.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be a single crystal, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from the surface side of the oxide semiconductor film, the proportion of crystal parts in the vicinity of the surface of the oxide semiconductor film is sometimes higher than that in the vicinity of the surface where the oxide semiconductor film is formed. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor including the CAAC-OS film, a change in electrical characteristics due to irradiation with visible light or ultraviolet light is small. Thus, the transistor has high reliability.

For example, the CAAC-OS film is formed by a sputtering method with a polycrystalline metal oxide sputtering target. By collision of ions with the target, a crystal region included in the target may be separated from the target along an a-b plane; in other words, a flat-plate-like or pellet-like sputtered particle having a plane parallel to an a-b plane may flake off from the target. In that case, the flat-plate-like sputtered particle reaches a substrate while maintaining its crystal state, whereby the CAAC-OS film can be formed.

For the deposition of the CAAC-OS film, the following conditions are preferably used.

By reducing the amount of impurities entering the CAAC-OS layer during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particles reach the substrate, migration occurs on the substrate, so that a flat plane of each flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn-based oxide target is described below.

The In—Ga—Zn-based oxide target, which is polycrystalline, is made as follows: $InO_X$ powder, $GaO_Y$ powder, and $ZnO_Z$ powder are mixed in a predetermined molar ratio, pressure is applied to the mixture, and heat treatment is performed at a temperature from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes $Na^+$ when an insulating film in contact with the oxide semiconductor film is an oxide and Na diffuses into the insulating film. Further, in the oxide semiconductor film, Na cuts or enters a bond between metal and oxygen which are included in the oxide semiconductor. As a result, for example, degradation of electrical characteristics of a transistor, such as a normally-on state of the transistor due to shift of the threshold voltage in the negative direction or reduction in mobility, occurs. In addition, variations in electrical characteristics also occurs. Specifically, the Na concentration according to secondary ion mass spectrometry is reduced to preferably less than or equal to $5 \times 10^{16}/cm^3$, further preferably less than or equal to $1 \times 10^{16}/cm^3$, still further preferably less than or equal to $1 \times 10^{15}/cm^3$. In a similar manner, the measurement value of Li concentration is preferably less than or equal to $5 \times 10^{15}/cm^3$, more preferably less than or equal to $1 \times 10^{15}/cm^3$. In a similar manner, the measurement value of K concentration is preferably less than or equal to $5 \times 10^{15}/cm^3$, more preferably less than or equal to $1 \times 10^{15}/cm^3$.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electric characteristics of the transistor are likely to deteriorate as in the case of using an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably less than or equal to $1 \times 10^{18}/cm^3$. In that case, the deterioration of the electric characteristics of the transistor can be prevented, so that the reliability of the PLD or the semiconductor device can be improved.

A metal in the source electrode and the drain electrode might extract oxygen from the oxide semiconductor film depending on a conductive material used for the source electrode and the drain electrode. In such a case, a region of the oxide semiconductor film in contact with the source electrode or the drain electrode becomes an n-type region due to the formation of an oxygen vacancy.

The n-type region serves as a source region or a drain region, resulting in a decrease in the contact resistance between the oxide semiconductor film and the source electrode or the drain electrode. Accordingly, the formation of the n-type region increases the mobility and on-state current of the transistor, which achieves high-speed operation of a switch circuit using the transistor.

Note that the extraction of oxygen by a metal in the source electrode and the drain electrode is probably caused when the source electrode and the drain electrode are formed by a sputtering method or when heat treatment is performed after the formation of the source electrode and the drain electrode.

The n-type region is more likely to be formed by forming the source electrode and the drain electrode with use of a conductive material which is easily bonded to oxygen. Examples of such a conductive material include Al, Cr, Cu, Ta, Ti, Mo, and W.

The oxide semiconductor film is not limited to a single-layer metal oxide film and may have a layered structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose lowest conduction band energy is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order to increase the carrier mobility.

In the transistor including the above oxide semiconductor film, when a voltage is applied to the gate electrode so that an electric field is applied to the semiconductor film, a channel region is formed in the second metal oxide film whose lowest conduction band energy is small in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

Further, when an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure allows reducing of variations in the electrical characteristics of the transistor, such as the threshold voltage.

Further, it is preferable that a plurality of metal oxide films be stacked so that an interface level due to an impurity existing between the metal oxide films, which inhibits carrier flow, is not formed at the interface between the metal oxide films. This is because when an impurity exists between the stacked metal oxide films, the continuity of the lowest conduction band energy between the metal oxide films is lost, and carriers are trapped or disappear by recombination in the vicinity of the interface. By reducing an impurity existing between the films, a continuous junction (here, in particular, a U-shape well structure whose lowest conduction band energy is changed continuously between the films) is formed more easily than the case of merely stacking a plurality of metal oxide films which share at least one main metal component.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to high vacuum (about $5\times10^{-7}$ Pa to $1\times10^{-4}$ Pa) with an entrapment vacuum evacuation pump such as a cryopump so that water or the like, which is an impurity for an oxide semiconductor, is removed as much as possible. Alternatively, a turbo molecular pump and a cold trap are preferably combined so as to prevent a backflow of a gas from an exhaust system to the inside of the chamber.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and is highly purified, moisture and the like can be prevented from entering the oxide semiconductor film as much as possible.

The first metal oxide film or the third metal oxide film may be an oxide film containing aluminum, silicon, titanium, gallium, germanium, yttrium, zirconium, tin, lanthanum, cerium, or hafnium at a higher atomic ratio than the second metal oxide film. Specifically, the first metal oxide film or the third metal oxide film may be an oxide film containing the above element at an atomic ratio one and a half times or more, preferably two times or more, and more preferably three times or more that in the second metal oxide film. The above element is strongly bonded to oxygen, and thus has a function of suppressing generation of oxygen vacancies in the oxide film. That is, oxygen vacancies are less likely to be generated in the first metal oxide film or the third metal oxide film than in the second metal oxide film.

Specifically, when both the second metal oxide film and the first or third metal oxide film are In—M—Zn-based oxide films and the atomic ratio of the first or third metal oxide film is In:M:Zn=$x_1$:$y_1$:$z_1$ and that of the second metal oxide film is In:M:Zn=$x_2$:$y_2$:$z_2$, the atomic ratios may be set so that $y_1/x_1$ is larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the atomic ratio is determined so that $y_1/x_1$ is one and a half times or more as large as $y_2/x_2$. Further preferably, the atomic ratio is determined so that $y_1/x_1$ is two times or more as large as $y_2/x_2$. Still further preferably, the atomic ratio is determined so that $y_1/x_1$ is three times or more as large as $y_2/x_2$. Further, it is preferable that $y_2$ be greater than or equal to $x_2$ in the second metal oxide film, in which case the transistor can have stable electrical characteristics. However, when $y_2$ is three times or more as large as $x_2$, the field-effect mobility of the transistor is reduced; accordingly, $y_2$ is preferably smaller than three times $x_2$.

The first metal oxide film and the third metal oxide film each have a thickness of 3 nm to 100 nm, preferably 3 nm to 50 nm. The second metal oxide film has a thickness of 3 nm to 200 nm, preferably 3 nm to 100 nm, and more preferably 3 nm to 50 nm.

In the three-layer semiconductor film, the first metal oxide film and the third metal oxide film can be amorphous or crystalline. Note that the second metal oxide film in which a channel region is formed preferably has a crystalline structure, in which case the transistor can have stable electrical characteristics.

Note that a channel formation region refers to a region of a semiconductor film of a transistor that overlaps with a gate electrode and that is between a source electrode and a drain electrode.

For example, in the case where an In—Ga—Zn-based oxide film formed by a sputtering method is used as each of the first metal oxide film and the third metal oxide film, the first metal oxide film and the third metal oxide film can be deposited with use of an In—Ga—Zn-based oxide target (In:Ga:Zn=1:3:2 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, in the case where the second metal oxide film is a CAAC-OS film, the second metal oxide film is preferably deposited with use of a polycrystalline In—Ga—Zn-based oxide target containing In, Ga, and Zn at an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the end portion of the semiconductor film included in the transistor may be inclined or may be rounded.

Also in the case where a semiconductor film including stacked metal oxide films is used in the transistor, a region in contact with the source electrode or the drain electrode can be an n-type region. Such a structure increases the mobility and on-state current of the transistor and achieves high-speed operation of a PLD or a semiconductor device using the transistor. Furthermore, in the case where the semiconductor film including the stacked metal oxide films is used in the transistor, the n-type semiconductor region particularly preferably reaches the second metal oxide film part of which is to be a channel region, in which case the mobility and on-state current of the transistor are further increased and higher-speed operation of the PLD or the semiconductor device is achieved.

As described above, the transistor 21 and the transistor 22 can be formed separately, and the transistor 21 can be stacked over the transistor 22, for example. Therefore, the channel length and the channel width of the channel formation region of the transistor 21 are not limited by the arrangement of the transistor 22. For example, the channel length of the OS transistor can be made larger than the channel length of the Si transistor. In addition, the channel width of the channel formation region of the OS transistor can be made larger than that of the Si transistor. By using the OS transistor as a switch or the like, the off-state current flowing when the OS transistor is off can be reduced more. This contributes to lower power consumption of semiconductor devices.

Figure 14A:
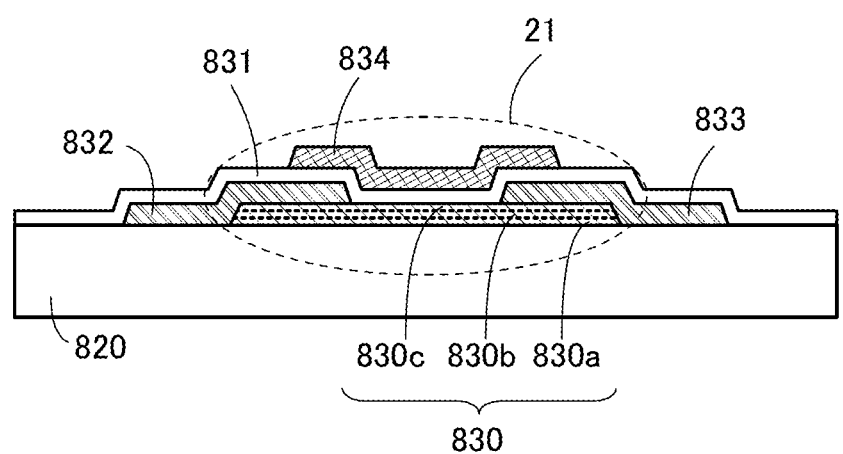
FIGS. 14A and 14B are diagrams each illustrating a semiconductor device in accordance with one embodiment of the present invention.
Figure 14B:
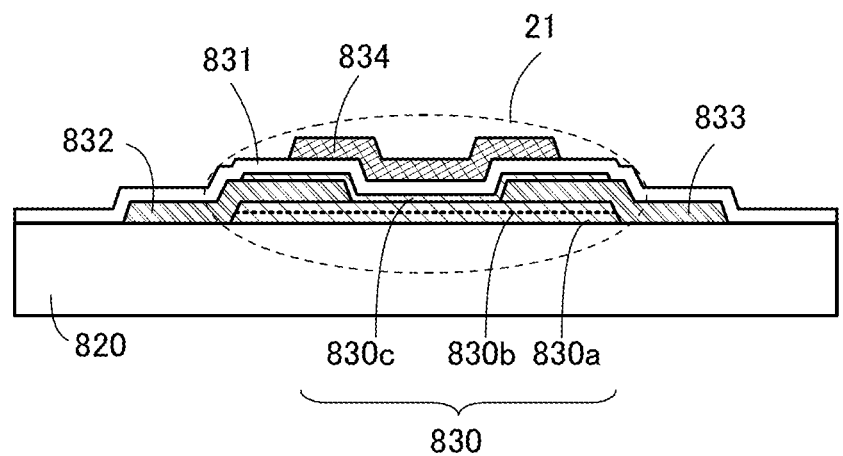

FIGS. 14A and 14B illustrate other cross-sectional structure examples of the transistor 21. The transistor 21 in FIG.

14A includes a semiconductor film 830 provided over an insulating film 820 or the like, conductive films 832 and 833 electrically connected to the semiconductor film 830, a gate insulating film 831, and a gate electrode 834 that is provided over the gate insulating film 831 to overlap with the semiconductor film 830.

The semiconductor film 830 is not necessarily a single oxide semiconductor film, but may be a stack of a plurality of oxide semiconductor films. FIG. 14A illustrates an example in which the semiconductor film 830 is formed using a stack of three oxide semiconductor films. Specifically, in the transistor 21 in FIG. 14A, oxide semiconductor films 830a to 830c are stacked sequentially from the insulating film 820 side as the semiconductor film 830.

Each of the oxide semiconductor films 830a and 830c is an oxide film that contains at least one of metal elements contained in the oxide semiconductor film 830b and in which energy at the bottom of the conduction band is closer to the vacuum level than that in the oxide semiconductor film 830b by higher than or equal to 0.05 eV, 0.07 eV, 0.1 eV, or 0.15 eV and lower than or equal to 2 eV, 1 eV, 0.5 eV, or 0.4 eV. The oxide semiconductor film 830b preferably contains at least indium because the carrier mobility is increased.

Note that as illustrated in FIG. 14B, the oxide semiconductor film 830c may be provided over the conductive films 832 and 833 to overlap with the gate insulating film 831.

With the Si transistor and the OS transistor formed in this manner, a semiconductor device of one embodiment of the present invention can be manufactured.

(Embodiment 4)

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic appliances that can be equipped with the semiconductor device of one embodiment of the present invention are mobile phones, game machines including portable game consoles, portable information appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 15A to 15E illustrate specific examples of these electronic devices.

Figure 15A:
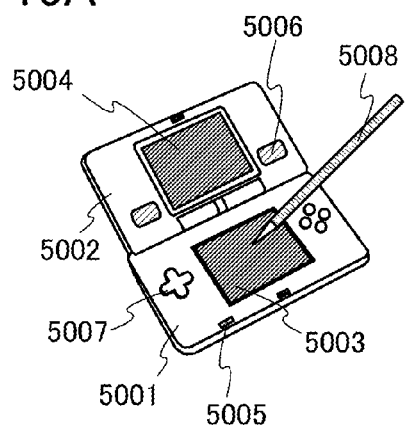
FIGS. 15A to 15F are diagrams each illustrating an electronic appliance in accordance with one embodiment of the present invention.

FIG. 15A illustrates a portable game console including a housing 5001, a housing 5002, a display portion 5003, a display portion 5004, a microphone 5005, a speaker 5006, an operation key 5007, a stylus 5008, and the like. Note that although the portable game console in FIG. 15A includes the two display portions 5003 and 5004, the number of display portions included in the portable game console is not limited to two.

Figure 15B:
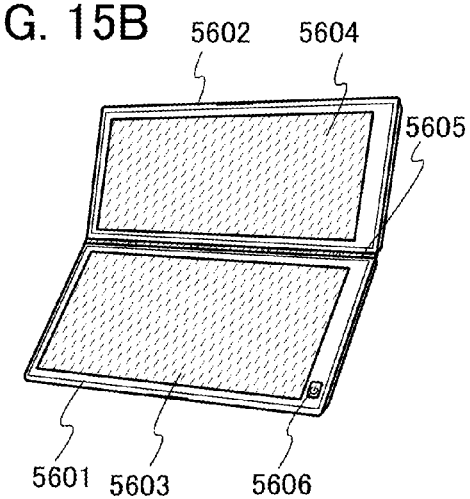

FIG. 15B illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel area of a display device.

Figure 15C:
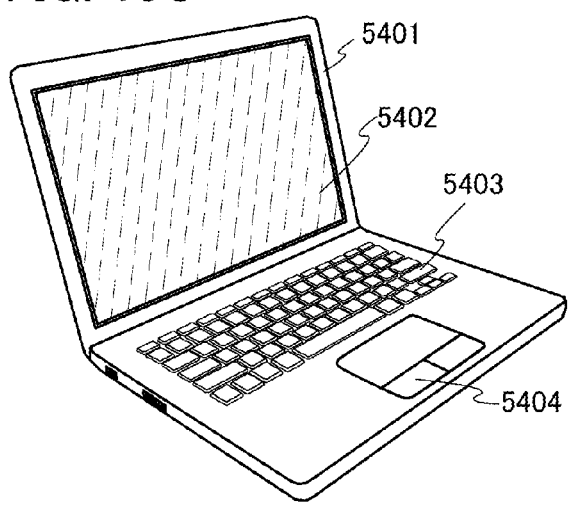

FIG. 15C illustrates a laptop personal computer including a housing 5401, a display portion 5402, a keyboard 5403, a pointing device 5404, and the like.

Figure 15D:
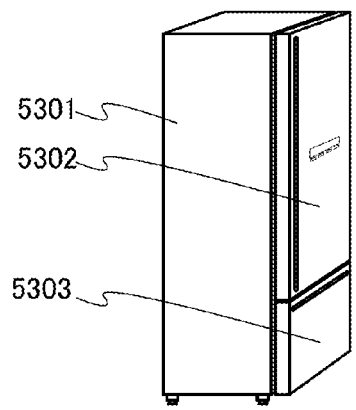

FIG. 15D illustrates an electric refrigerator-freezer including a housing 5301, a refrigerator door 5302, a freezer door 5303, and the like.

Figure 15E:
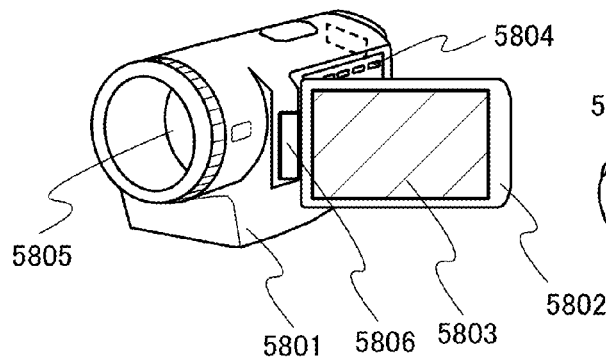

FIG. 15E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 15F:
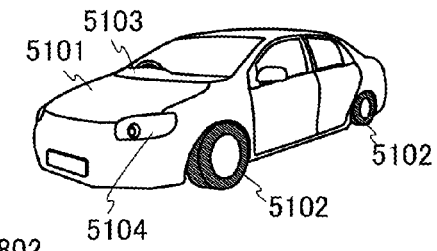

FIG. 15F illustrates a passenger car including a car body 5101, wheels 5102, a dashboard 5103, lights 5104, and the like.

This application is based on Japanese Patent Application serial no. 2013-051944 filed with Japan Patent Office on Mar. 14, 2013, the entire contents of which are hereby incorporated by reference.

What is claimed is:

1. A semiconductor device comprising:
an input-output terminal;
a three-state buffer directly connected to the input-output terminal; and
a first circuit electrically connected to the input-output terminal, the first circuit comprising a first inverter, a second inverter, and a first switch,
wherein an input terminal of the first inverter is electrically connected to an output terminal of the second inverter,
wherein an output terminal of the first inverter is electrically connected to an input terminal of the second inverter, and
wherein the first inverter is electrically connected to a high-potential power source or a low-potential power source via the first switch.

2. The semiconductor device according to claim 1, wherein the first switch includes a transistor comprising a channel including an oxide semiconductor layer.

3. The semiconductor device according to claim 1, wherein the first inverter and the second inverter each include a transistor comprising a channel including a semiconductor layer containing silicon.

4. The semiconductor device according to claim 2, wherein the oxide semiconductor layer comprises In and Zn.

5. An electronic device comprising the semiconductor device according to claim 1.

6. The semiconductor device according to claim 1, wherein the semiconductor device is configured so that the first switch is off when data is input to or output from the input-output terminal, regardless of a content of the data.

7. A semiconductor device comprising:
an input-output terminal;
a three-state buffer directly connected to the input-output terminal;
a first circuit electrically connected to the input-output terminal, the first circuit comprising a first inverter, a second inverter, and a first switch;
a second circuit electrically connected to the first circuit,
wherein an input terminal of the first inverter is electrically connected to an output terminal of the second inverter,
wherein an output terminal of the first inverter is electrically connected to an input terminal of the second inverter,
wherein the first inverter is electrically connected to a high-potential power source or a low-potential power source via the first switch, and
wherein the input-output terminal serves as an input terminal or an output terminal.

8. The semiconductor device according to claim 7, wherein the first switch includes a transistor comprising a channel including an oxide semiconductor layer.

9. The semiconductor device according to claim 7, wherein the first inverter and the second inverter each include a transistor comprising a channel including a semiconductor layer containing silicon.

10. The semiconductor device according to claim 8, wherein the oxide semiconductor layer comprises In and Zn.

11. An electronic device comprising the semiconductor device according to claim 7.

12. The semiconductor device according to claim 7, wherein the semiconductor device is configured so that the first switch is off when data is input to or output from the input-output terminal, regardless of a content of the data.

13. A semiconductor device comprising:
an input-output terminal;
a first circuit electrically connected to the input-output terminal, the first circuit comprising a first inverter, a second inverter, a first switch, a second switch, and a third switch;
a second circuit electrically connected to the first circuit;
wherein an input terminal of the first inverter is electrically connected to an output terminal of the second inverter,
wherein an output terminal of the first inverter is electrically connected to an input terminal of the second inverter,
wherein the first inverter is electrically connected to a high-potential power source or a low-potential power source via the first switch and the second switch,
wherein the input-output terminal is electrically connected to a resistor via the third switch, and
wherein the input-output terminal serves as an input terminal or an output terminal.

14. The semiconductor device according to claim 13, wherein at least one of the first, second, and third switches includes a transistor comprising a channel including an oxide semiconductor layer.

15. The semiconductor device according to claim 13, wherein the first inverter and the second inverter each include a transistor comprising a channel including a semiconductor layer containing silicon.

16. The semiconductor device according to claim 14, wherein the oxide semiconductor layer comprises In and Zn.

17. An electronic device comprising the semiconductor device according to claim 13.

18. The semiconductor device according to claim 13, further comprising a three-state buffer directly connected to the input-output terminal.

19. The semiconductor device according to claim 13, wherein the semiconductor device is configured so that the first switch is off or the second switch is off when data is input to or output from the input-output terminal, regardless of a content of the data.

* * * * *